United States Patent [19]

Kamath

[11] 4,251,831

[45] Feb. 17, 1981

[54] FILTER AND SYSTEM INCORPORATING THE FILTER FOR PROCESSING DISCRETE SAMPLES OF COMPOSITE SIGNALS

[76] Inventor: Bantval Y. Kamath, 129 Dolton Ave., San Carlos, Calif. 94070

[21] Appl. No.: 88,719

[22] Filed: Oct. 26, 1979

[51] Int. Cl.³ .............................................. H04N 9/535
[52] U.S. Cl. .................................. 358/21 R; 358/163
[58] Field of Search .................... 358/21, 13, 163, 160, 358/8

[56] References Cited

U.S. PATENT DOCUMENTS 4,143,396  3/1979  MacKenzie ............................. 358/8

Primary Examiner—Richard Murray

[57] ABSTRACT

A system for processing discrete digitized samples representing composite signals utilizing a filter which eliminates a periodic signal component from the composite signal. The filter receives and stores consecutive digital sample representations of the composite signal and, for each received sample representation, provides a digital average representation of the values of a selected number of the received digital sample representations which define a zero average value of the periodic signal component. In one embodiment of the signal processing system, the filter is arranged in circuit with digital delays and digital signal combining and differencing circuits to form a digital color television signal dropout compensator, which is adaptable for use in NTSC, PAL, PAL-M, or other television standard systems. In a dropout compensator adapted for NTSC color television signals, the filter receives the digital composite television signal and eliminates the chrominance component therefrom, leaving only the luminance component at its output. A following digital subtractor is coupled to subtract the luminance component provided by the filter from the received digital composite television signal and provide the chrominance component at its output. The separated chrominance component is phase adjusted on consecutive television lines and recombined with the separated luminance component provided by the filter for substitution in the television signal in place of the dropout affected portion thereof. The dropout compensator also includes a digital delay of one horizontal line period through which the television signal components are passed to provide the delay necessary for substituting television signal information from a prior horizontal line.

54 Claims, 25 Drawing Figures

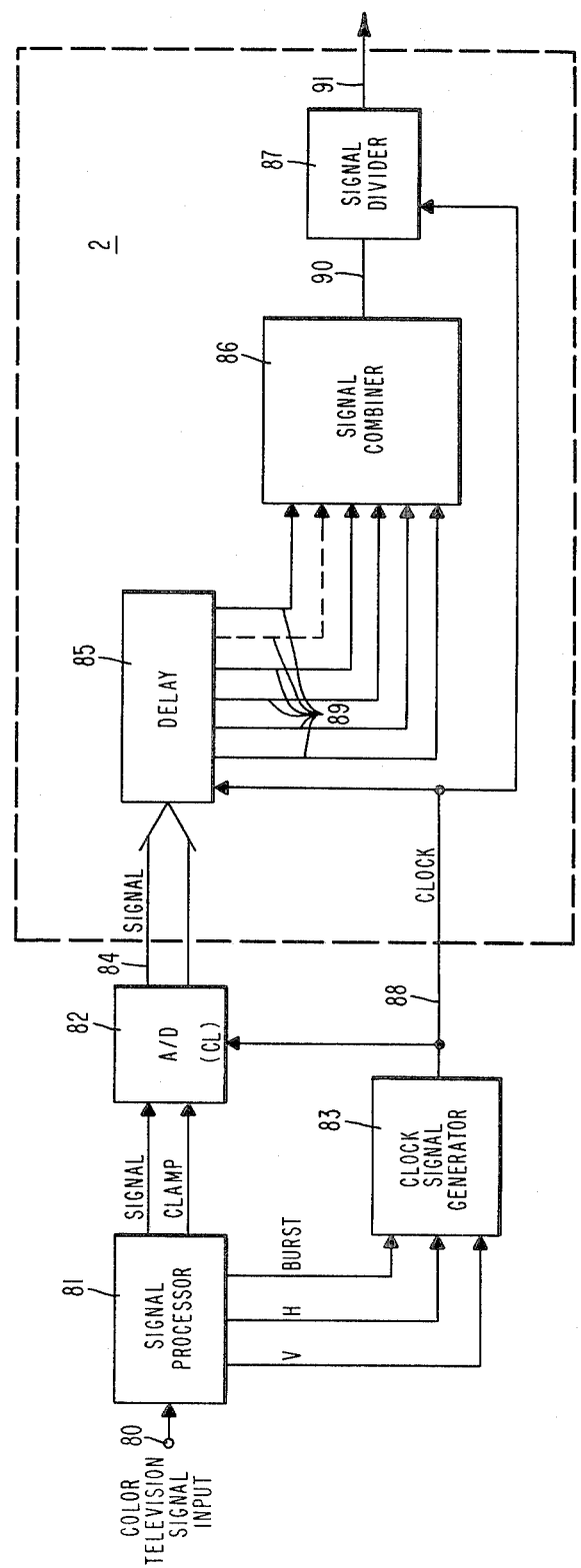
FIG_1

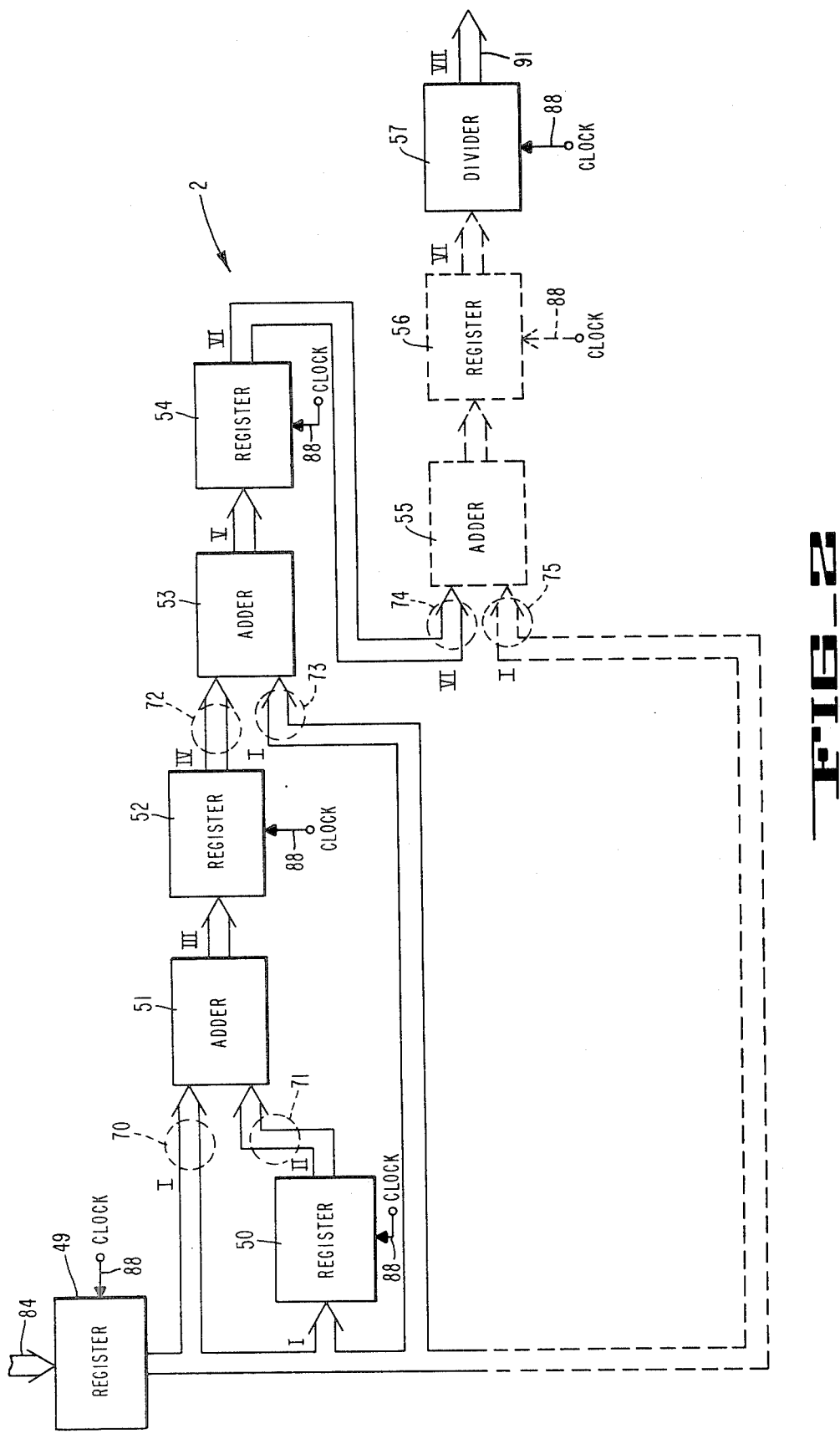

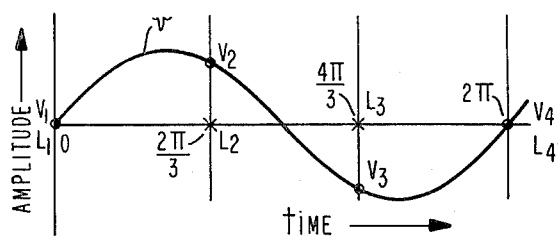
FIG_3a
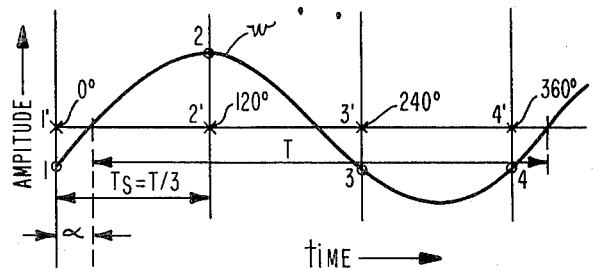
FIG_3b
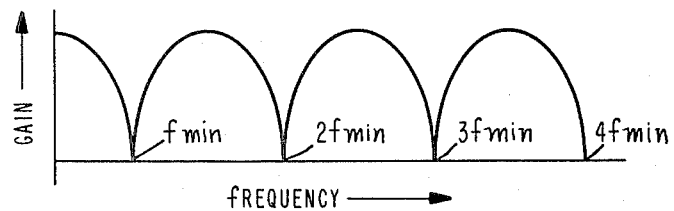
FIG_4
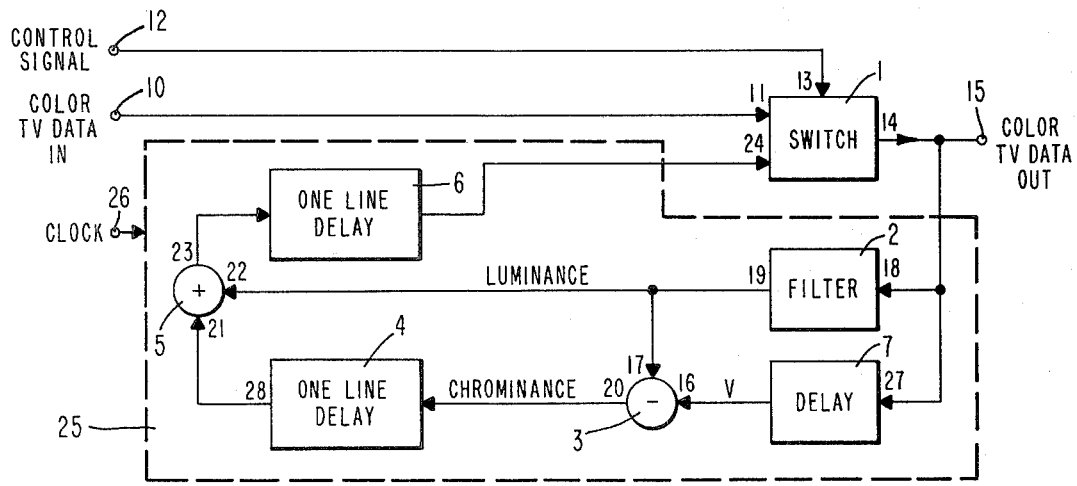
FIG_8

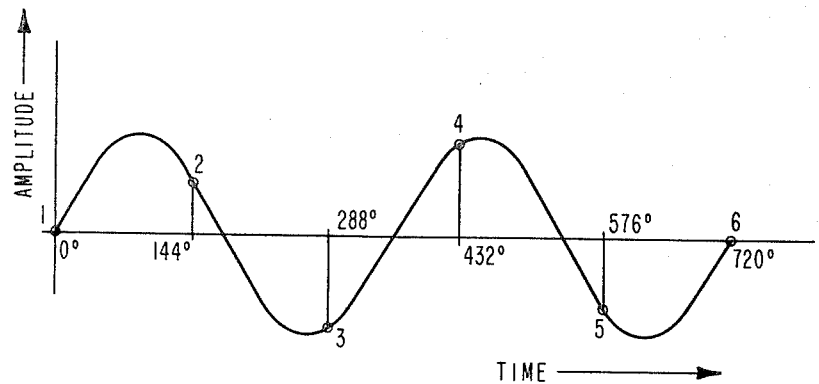
FIG_6
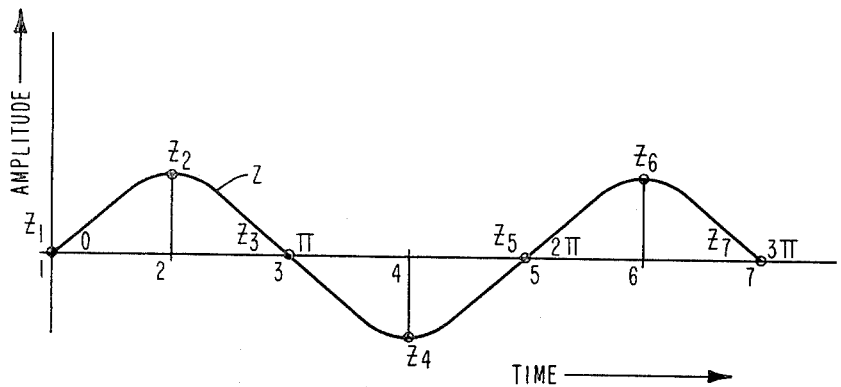
FIG_7
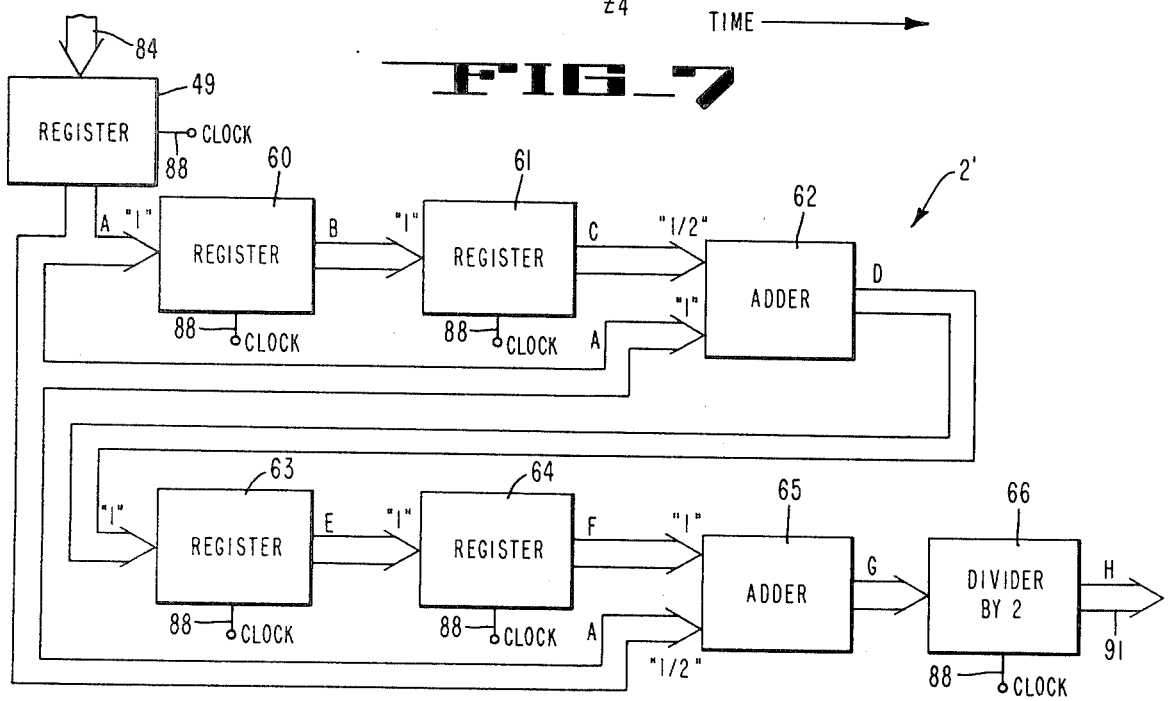
FIG_8

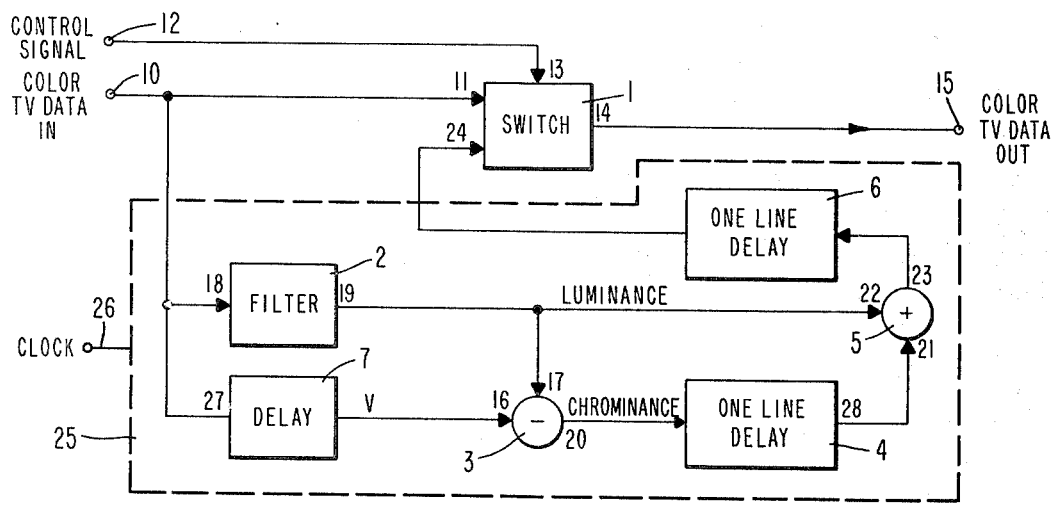
FIG_9
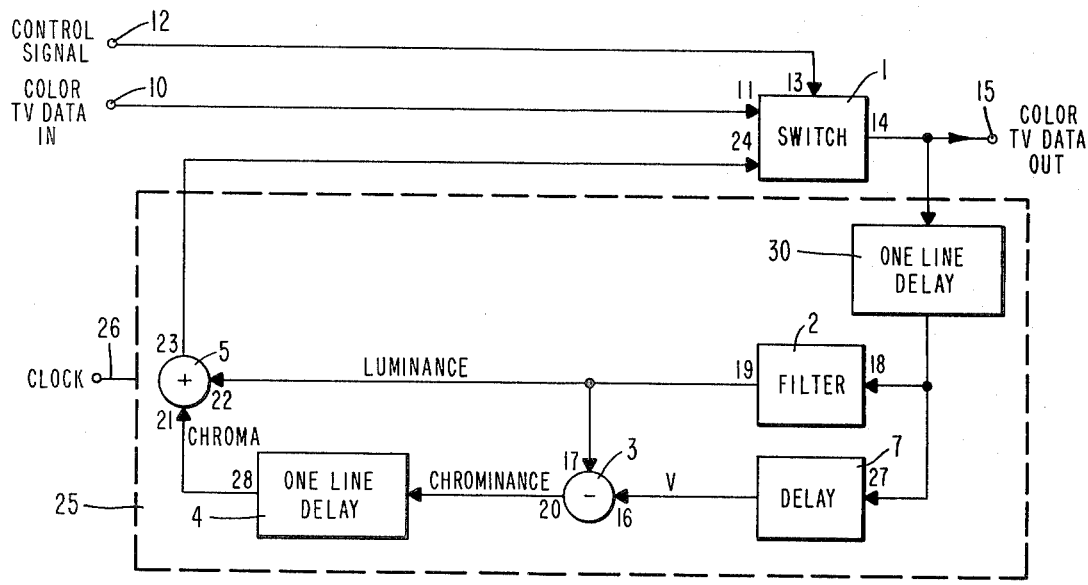
FIG_10
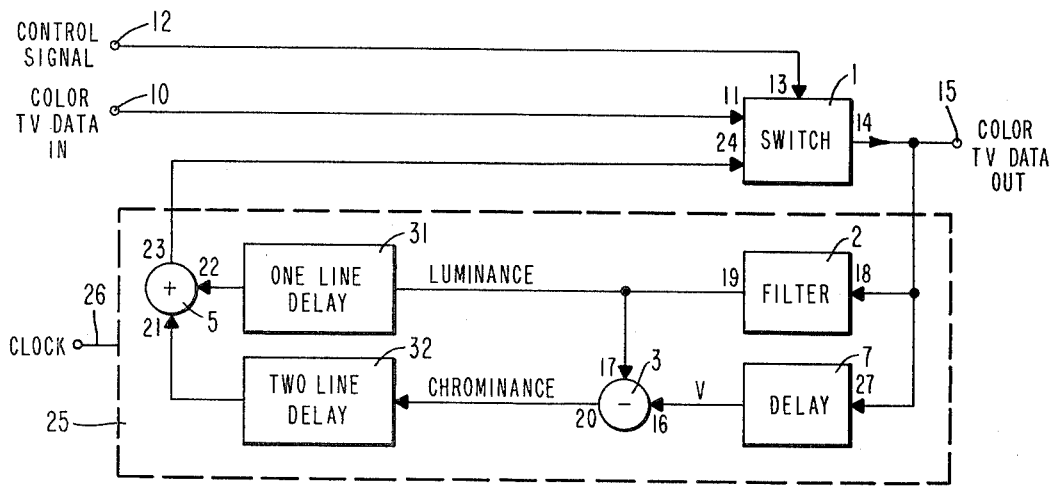
FIG_11

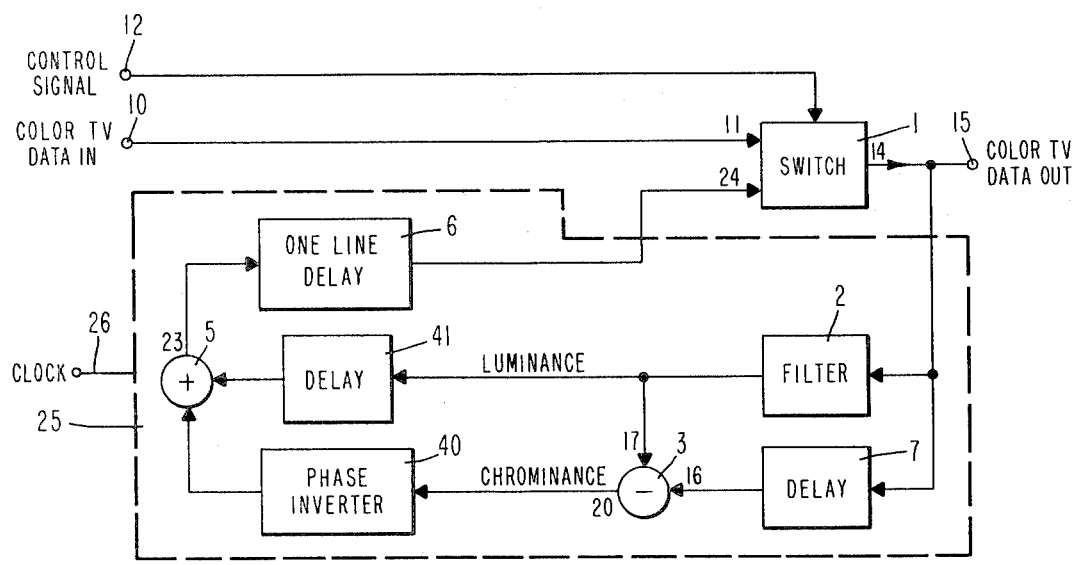
FIG_12
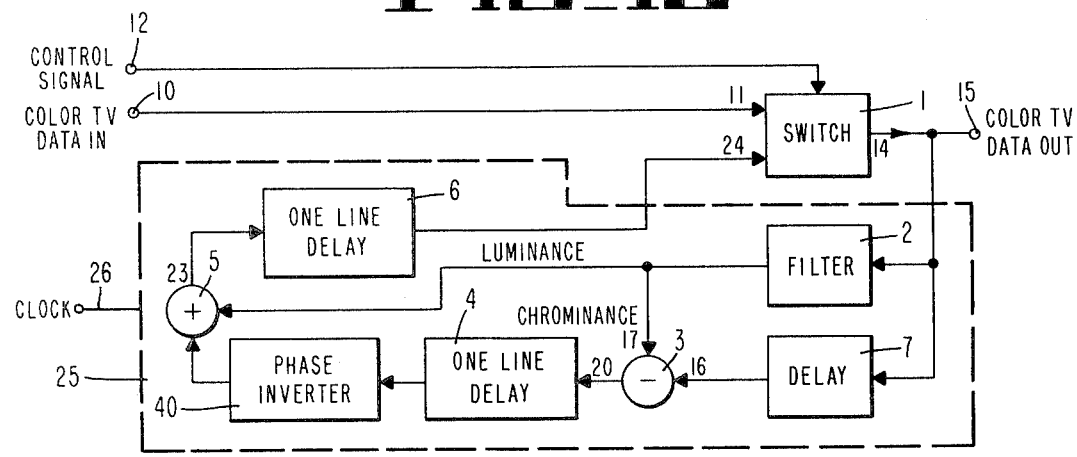
FIG_14
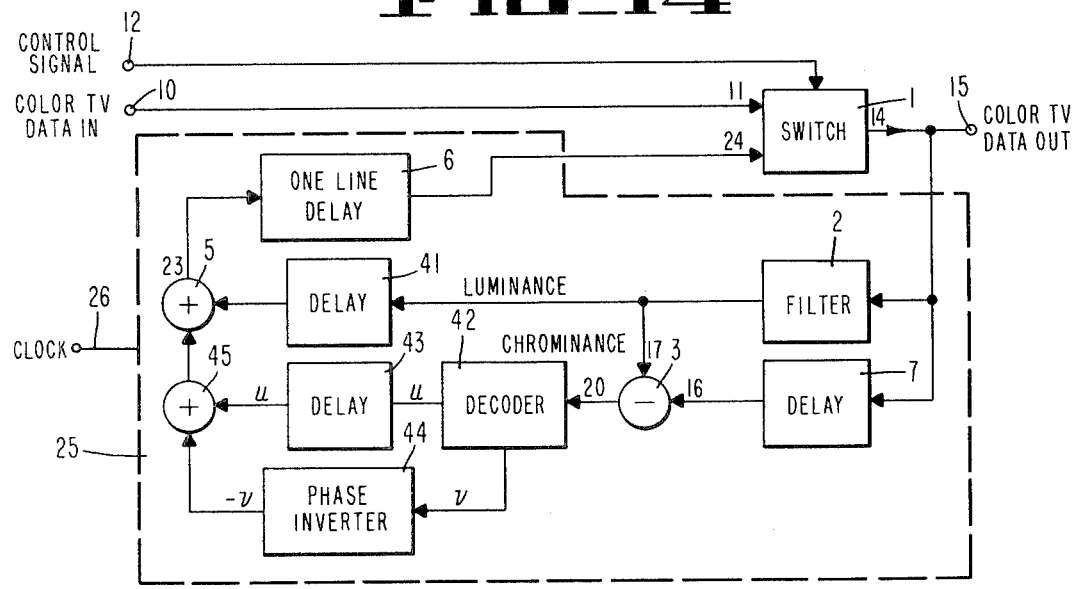
FIG_15

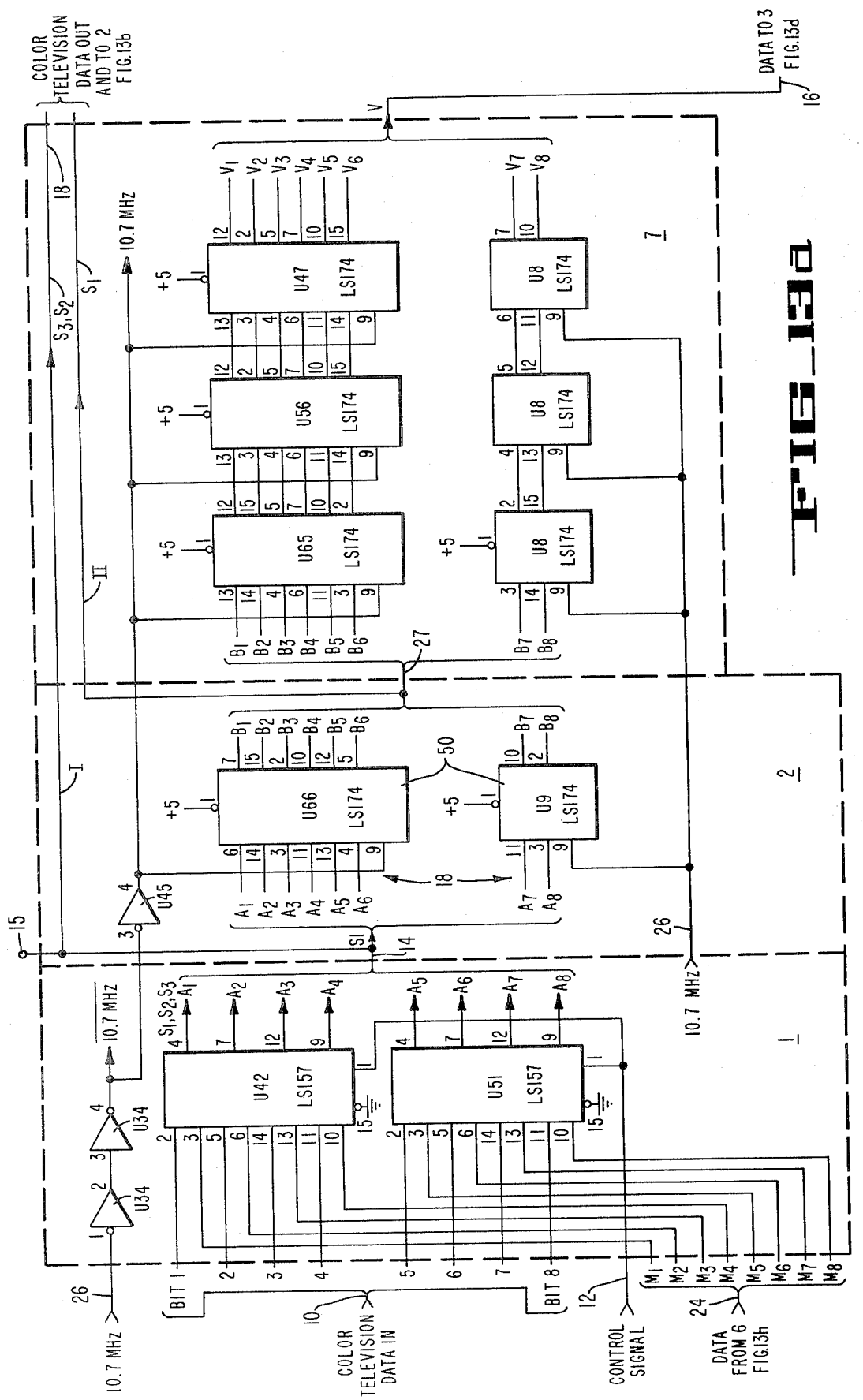

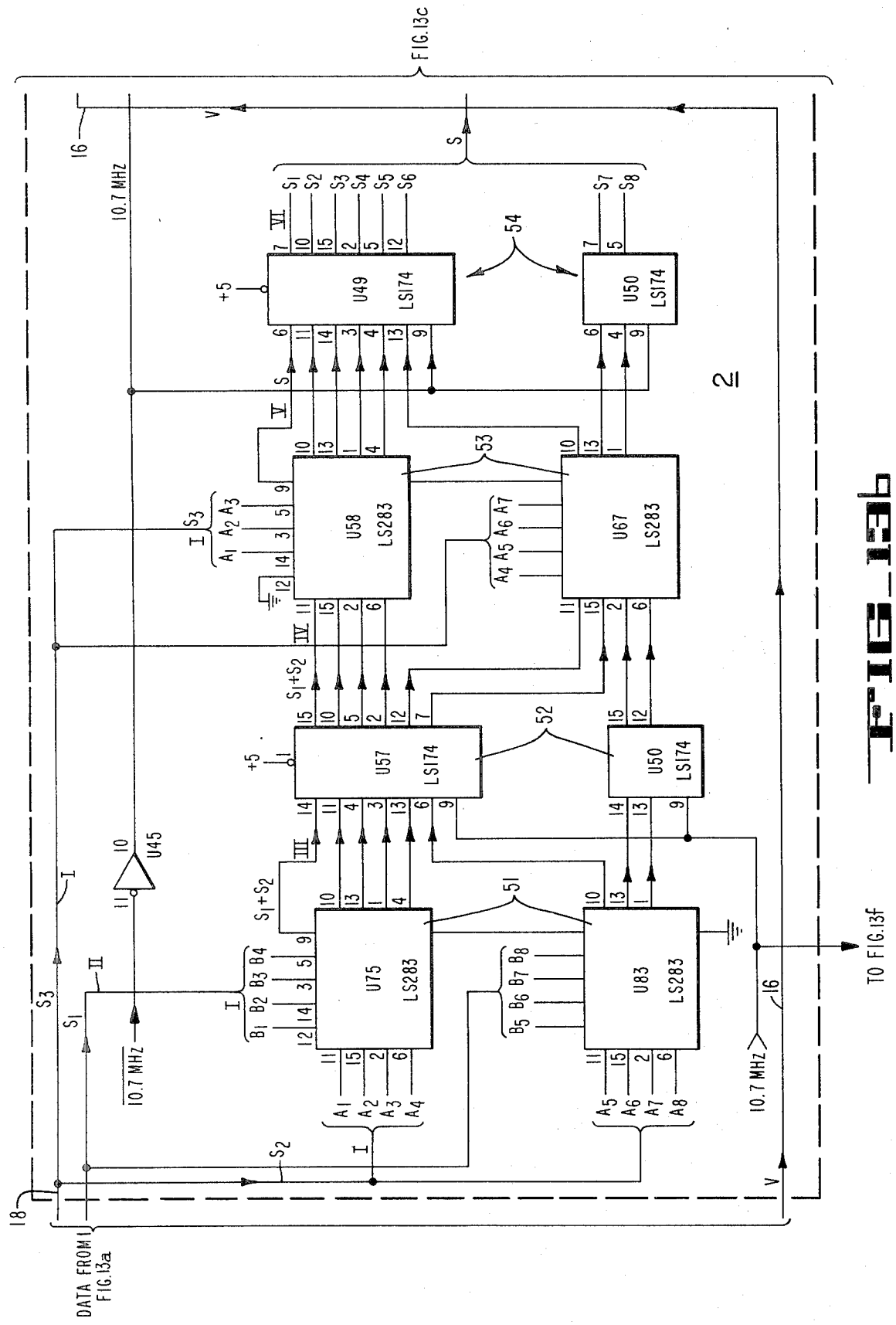

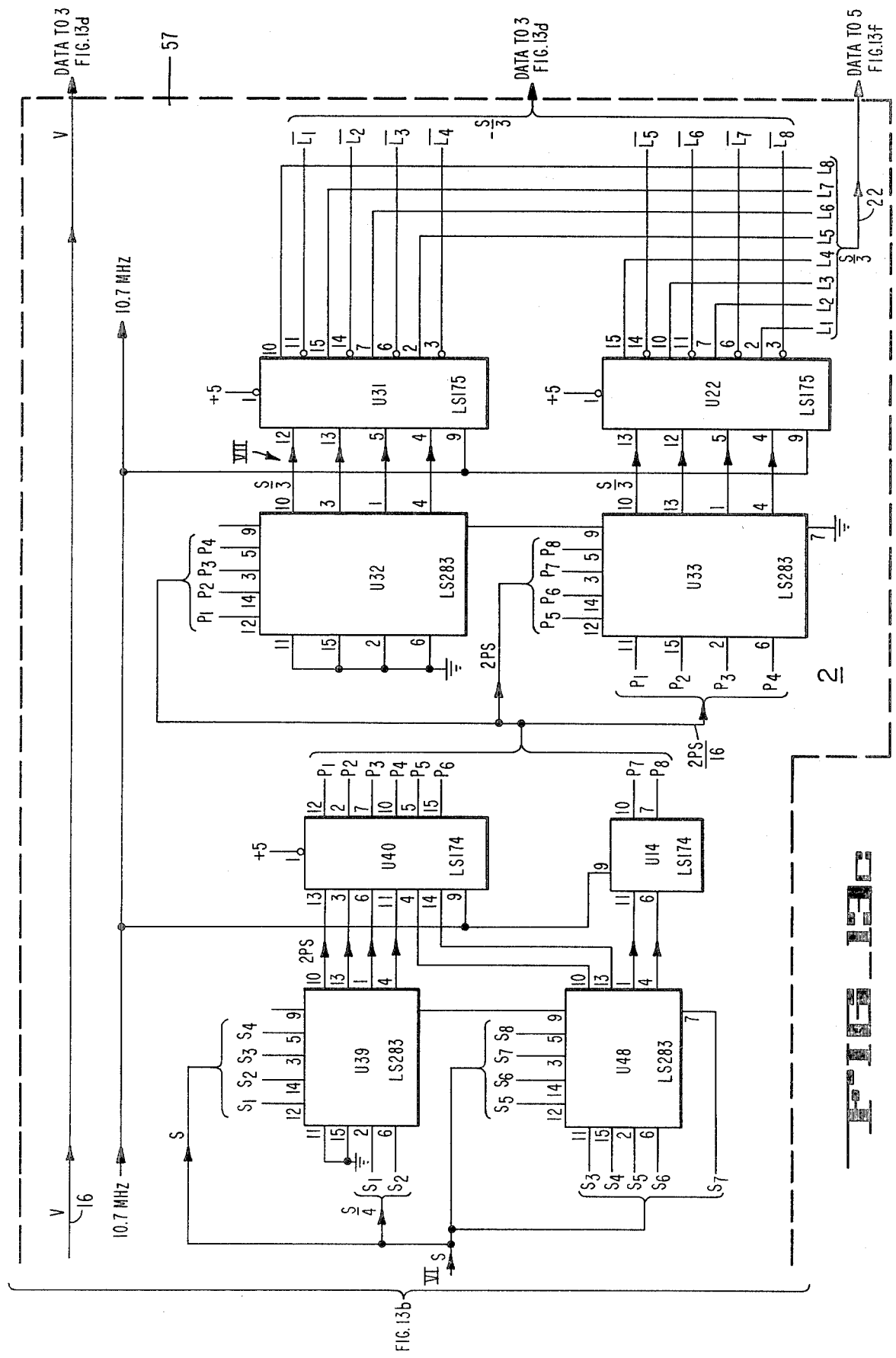

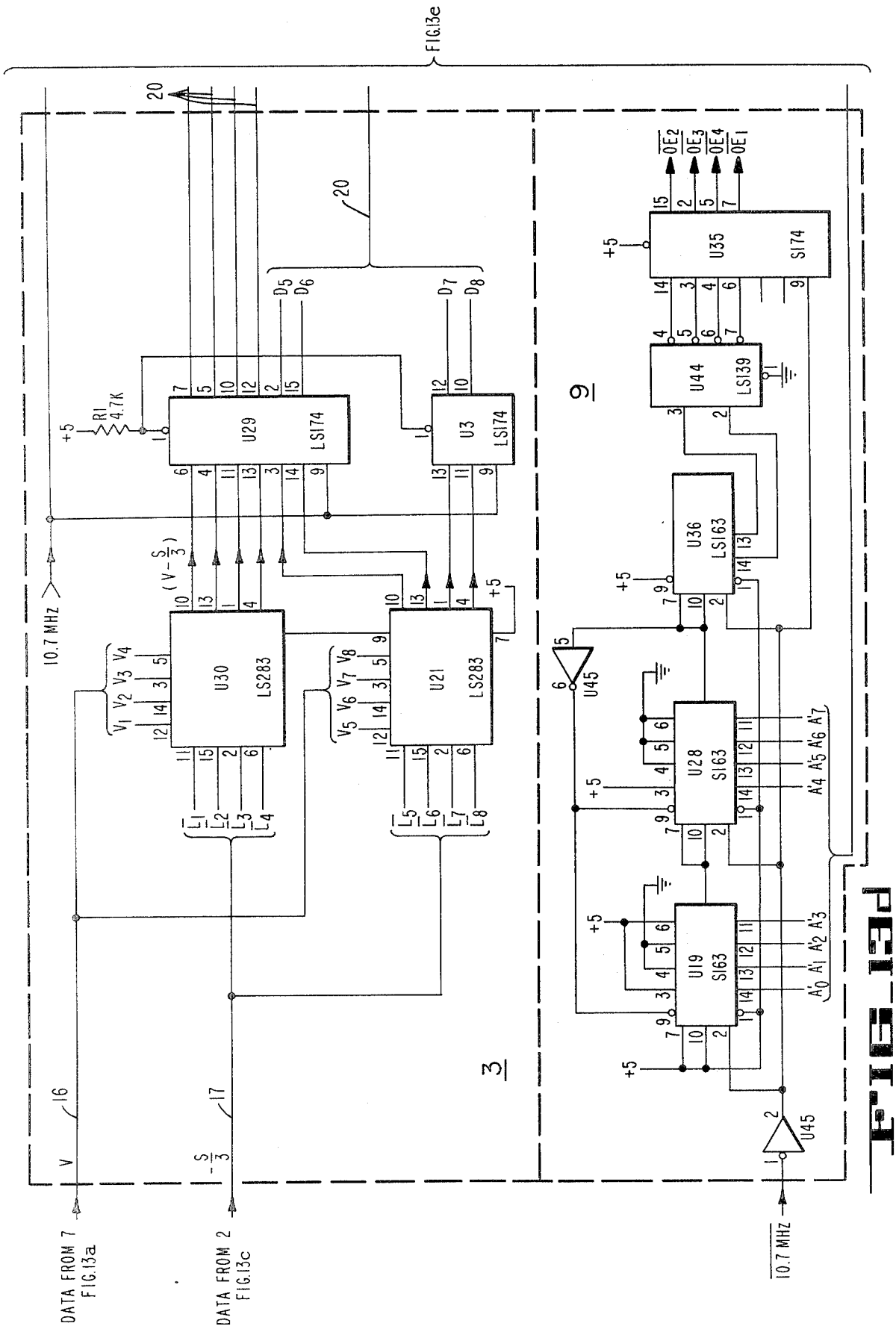

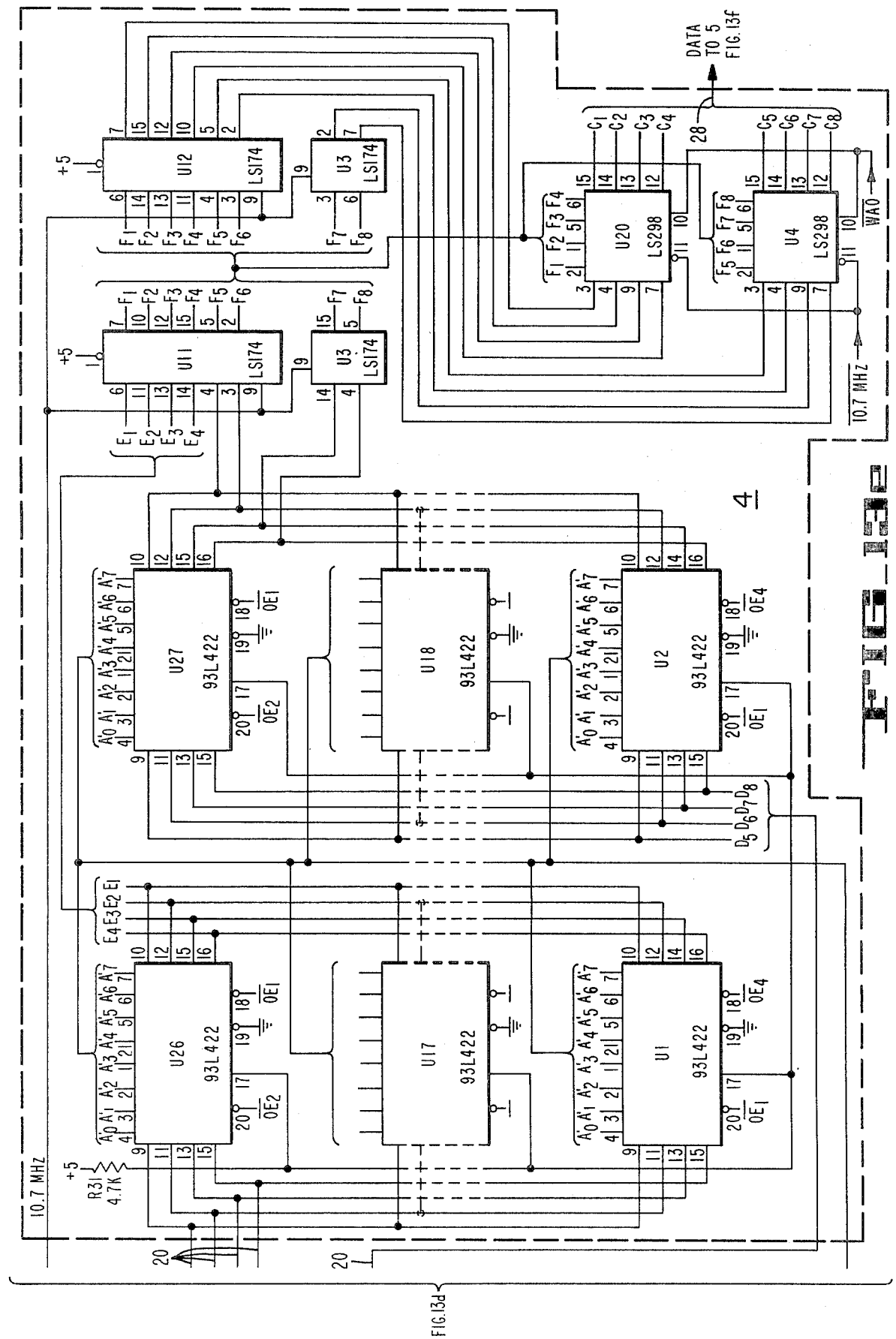

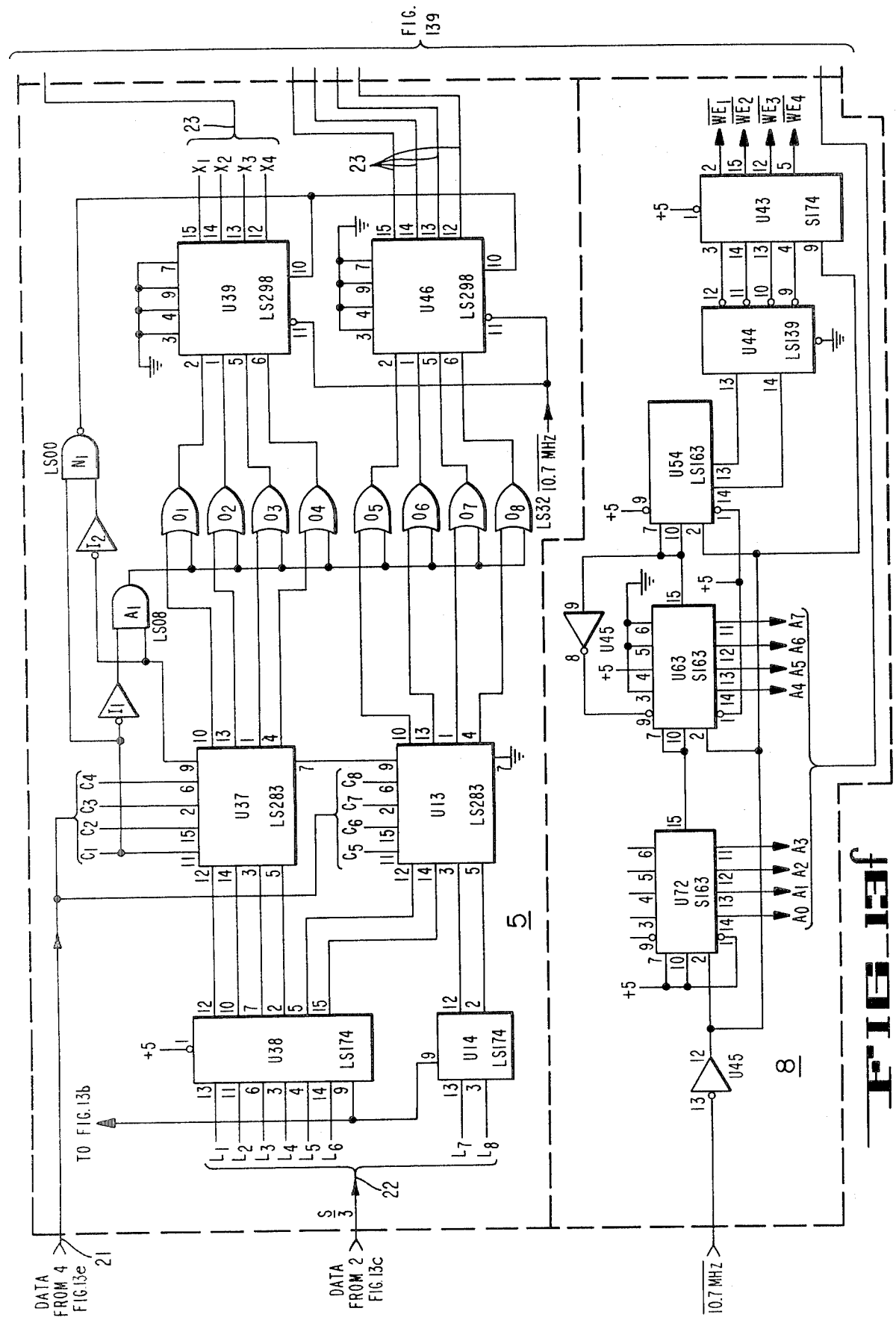

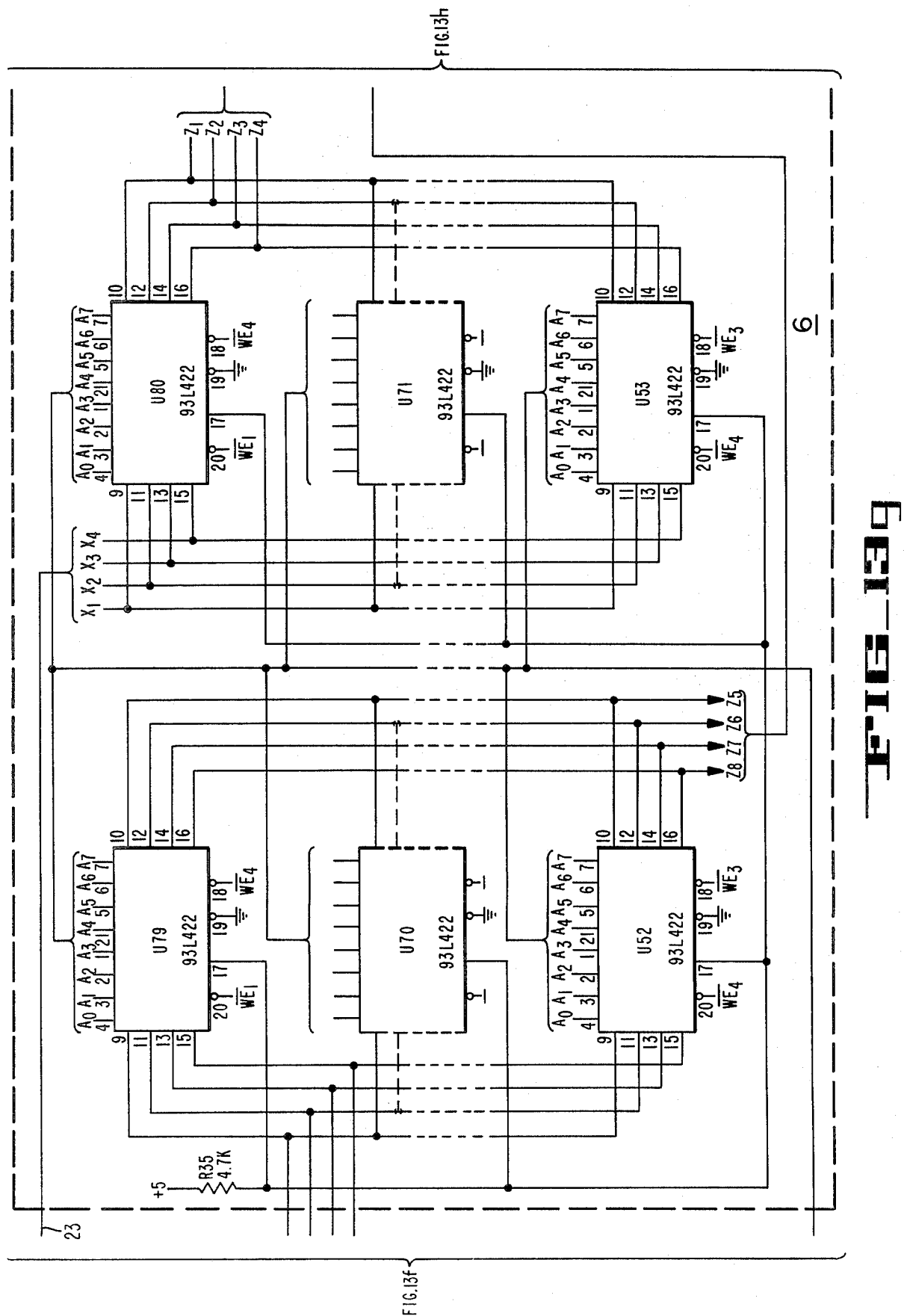

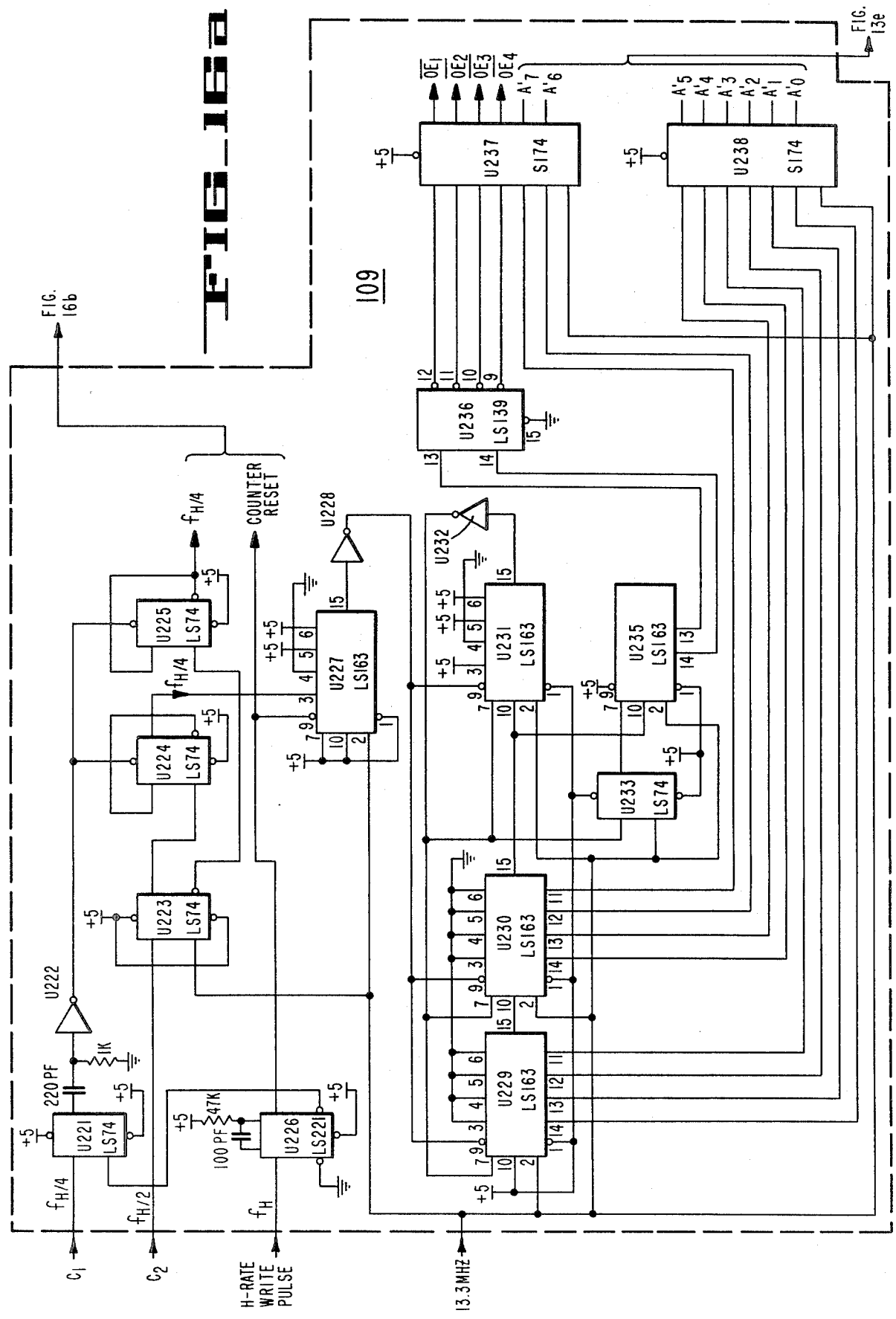

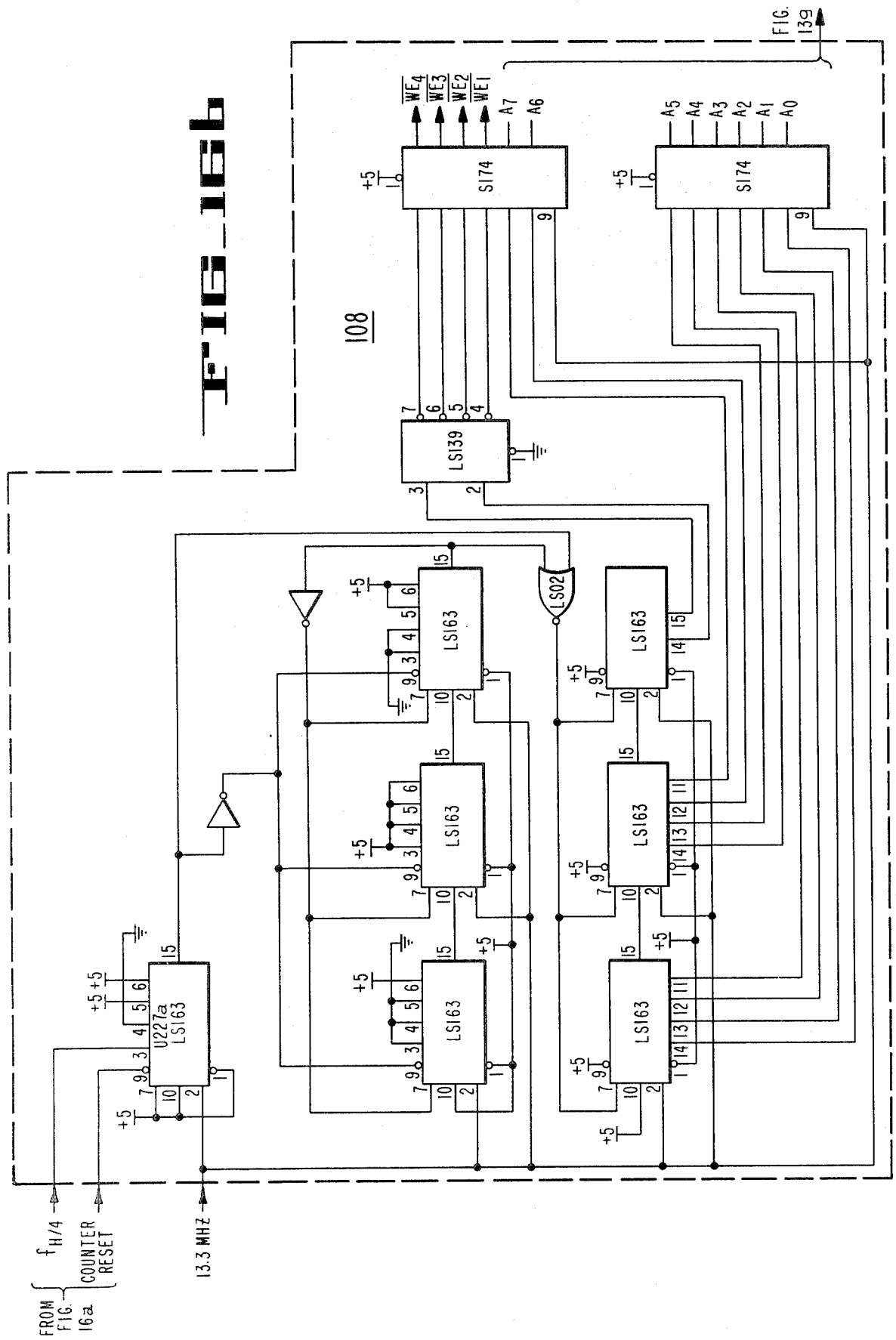

FILTER AND SYSTEM INCORPORATING THE FILTER FOR PROCESSING DISCRETE SAMPLES OF COMPOSITE SIGNALS

BACKGROUND OF THE INVENTION

The present invention relates to a filter for processing composite signals and a dropout compensator utilizing the filter and, more particularly, to a filter for processing digital representations of composite signals and a digital dropout compensator utilizing the filter for separating components of a composite signal.

In systems for processing composite signals, it is often desirable to separate various signal components into different signal paths for individual processing and then recombine the processed components into a composite signal form for further use. Known devices for separating composite signals composed of different frequency components are comb filters. Generally, comb filters are known as multiple bandpass filters designed to pass signals of selected frequency bands and to reject signals outside the selected frequency bands. For example, in processing color television signals, comb filters are widely utilized for separating the luminance and chrominance components. One such comb filter produces the desired separation by processing discrete digitized samples representing the analog color television signal and providing a weighted average of three samples taken from three consecutive horizontal lines of the same field at vertically aligned picture elements of the lines. The averaging is repeated for all picture elements. While this method is applicable to analog signals, it is particularly suitable for digitally encoded signals, since these typically represent samples of discrete signal values occurring at a known sampling frequency. However, to obtain samples from the vertically aligned picture elements often requires selection of special sampling rates or special sampling phases and the addition of further sample processing circuits, thus complicating the apparatus.

For example, in some standard color television signal systems, the color subcarrier signal component differs in phase on adjacent lines of the television field raster. In NTSC systems, the phase difference is 180 degrees; and, in PAL and PAL-M systems, it is 90 degrees. Some digital signal processing systems for such television signals utilize a sampling signal frequency that is an odd multiple of the subcarrier signal frequency. To obtain samples of such television signals corresponding to locations of vertically aligned picture elements, the aforementioned further circuits are necessary to provide line-to-line phase adjustment of the sampling of the television signal. If samples corresponding to locations of vertically misaligned picture elements are comb filtered, picture distortion results. As an example, a circuit for generating samples corresponding to vertically aligned picture element locations within a television field raster is described in U.S. Pat. No. 4,075,656. The above patent reveals that such circuit contributes to the complexity of the overall system for processing digitized colored television signals. A prior art digital comb filter circuit suitable for NTSC systems is described in U.S. Pat. No. 4,143,396. While this type of comb filtering is suitable for NTSC systems, the specific embodiments described in the U.S. Pat. No. 4,143,396 must be provided with further processing circuitry for other color television systems, such as PAL, PAL-M, etc., where the different chrominance component line-to-line phase characteristics create additional problems in obtaining samples corresponding to locations of vertically aligned picture elements of consecutive lines.

Color television signal dropout compensators are examples of television signal processing devices in which the above problems are encountered. Dropout compensators are widely utilized in systems for processing color television signals, such as for magnetic recording and reproduction, to replace a deficient or missing portion of the color television signal information, commonly called a "dropout", due to unpredictable instantaneous malfunction of the system or to diminutive defects of the recording medium. When such dropouts occur in the television signal, they produce visible disturbances in the displayed picture. Dropout compensators reduce the disturbing effect of dropouts seen by the viewer.

Most prior art analog dropout compensators employ an R. F. envelope level detector which monitors the amplitude level of the modulated television signal carrier waveform. A switch normally applies the incoming continuous television signal to an output terminal of the compensator. A delay line is arranged in the television signal path, for example, between an input terminal of the compensator and an input terminal of the switch or between the output terminal of the compensator and the input terminal of the switch. When a drop in the R. F. envelope level is detected, the switch is controlled to apply the delayed signal to the output terminal, instead of the incoming television signal. The delayed signal thus replaces the deficient information. When the R. F. envelope level returns to normal, the switch is controlled to switch its input from the delayed signal back to the incoming television signal, which is then applied to the output teminal. As an example, a prior art analog dropout compensator of the above type is descried in the U.S. Pat. No. 2,996,576.

There are known analog dropout compensators utilized in color television systems which separate the continuous color television signal into the luminance and chrominance components, delay the components by one or two television line periods and invert the chrominance component on consecutive lines to assure its proper phase when substituted for a dropout in the color television signal. However, in color television systems in which the signal is in the form of digitized samples, utilization of digital comb filters for separating the components often requires use of the aforementioned additional complex signal processing circuits to obtain samples corresponding to vertically aligned picture element locations throughout each field of the television signal.

An example of another prior art digital dropout compensator is described in the manual "AVR-2 Video Tape Recorder, Theory of Operation", Catalog No. 18009179-01, published by Ampex Corporation, November, 1977, pages 9-10, 9-14, 9-20 and 9-77 to 9-92. This particular dropout compensator replaces individual digital samples of data or an entire line of data with the corresponding data from an earlier occurring line of the same field. The dropout signal to be substituted for the deficient information is stored alternately on a line-by-line basis in one of two 256-bit shift registers forming a two-line delay circuit. While the data for one horizontal line is being written into one of the shift registers, the data from two lines earlier is being read out from the same shift register. In this latter application, the chrominance and luminance signals are not separated for processing. However, the color television signal information replacing the dropout signal is delayed by two lines of the same field. The interlacing property of typical television signals results in the delayed signal appearing in the display of the television signal at a location four horizontal line positions away from its real time position. In some cases, the display of the dropout compensated signal is quite disturbing to the eye, especially if shapr vertically-oriented patterns are represented on the screen. Such vertically-oriented patterns will be horizontally displaced in the dropout compensation lines relative to the adjacent undelayed lines.

SUMMARY OF THE INVENTION

It is an object of the present invention to provide a system for processing composite signals represented by discrete samples and having recurrent intervals of similar information content to separate the components for further processing and subsequent recombination to reconsitute an altered composite signal.

It is still a further object of the invention to provide a dropout compensator for color television signals represented by discrete samples, in which compensator the dropout affected luminance information is replaced by luminance information preceding the dropout affected line by one television line and the dropout affected chrominance information is replaced by chrominance information proceding the dropout affected line by one or two television lines.

It is another object of the invention to provide a filter circuit for eliminating a selected frequency component from a composite signal represented by discrete samples and having recurrent intervals of similar information content, by combining consecutive sample representations of the composite signal within the same recurrent interval which define a zero average value of the selected frequency component.

It is another object of the present invention to provide a filter for separating components of a composite signal represented by discrete samples and having recurrent intervals of similar information content, which filter does not require samples taken of the same phase positions of the recurrent intervals of the composite signal.

It is still another object of the invention to provide a filter circuit of the comb filter type for eliminating selected harmonically related frequency components from a digitized composite signal having recurrent intervals of similar information content by combining consecutive digital representations of the composite signal within the same recurrent interval.

It is a further object of the invention to provide a digital filter for separating a selected periodic signal component of a known frequency which is symmetrical with respect to a signal crossing axis from a digitally encoded composite signal.

It is a further object of the invention to provide a simplified digital dropout compensator suitable for use in color television systems for various television signal standards, in which compensator the luminance component is delayed by one horizontal line period and the chrominance component is phase-adjusted to have a known predetermined phase with respect to that horizontal line period for which the dropout compensation is provided.

The foregoing and other objects, features and advantages of the present invention will be apparent from the following detailed description thereof, herein taken with reference to the accompanying drawings.

BRIEF DESCRIPTION OF THE DRAWINGS

FIG. 1 is a block diagram of a preferred embodiment of the filter circuit of the invention.

FIG. 2 is a block diagram of a preferred embodiment of the filter circuit of the invention.

FIGS. 3a and 3b are graphical representations of the generation of digitized samples processed by the embodiment of the filter circuit of the invention illustrated by FIG. 2.

FIG. 4 is an example of a frequency characteristic of the embodiment of the filter circuit of the invention illustrated by FIG. 2.

FIG. 5 is a graphical representation of the generation of digitized samples processed by an alternative embodiment of the filter circuit illustrated by FIG. 2.

FIG. 6 is a block diagram of an alternative embodiment of the filter circuit of the invention.

FIG. 7 is a graphical representation of the generation of digitized samples processed by the embodiment of the filter circuit of the invention illustrated by FIG. 6

FIGS. 8 to 12 are block diagrams of various preferred embodiments of the dropout compensator of the invention utilizing the filter circuit of the invention.

FIGS. 13a to 13h are consecutive parts of a detailed circuit diagram of the filter circuit embodiment illustrated in the block diagram of FIG. 8.

FIGS. 14 and 15 are block diagrams of embodiments of the dropout compensator of the invention utilizing the filter circuit of the invention and arranged for compensating PAL and PAL-M color television signals.

FIGS. 16a and 16b are consecutive parts of a detailed circuit diagram of an alternative memory address generator embodiment for use in the dropout compensator illustrated in FIGS. 8a to 8h to adapt the compensator for PAL color television signal applications.

DESCRIPTION OF THE PREFERRED AND ALTERNATIVE EMBODIMENTS

Figure 13H:
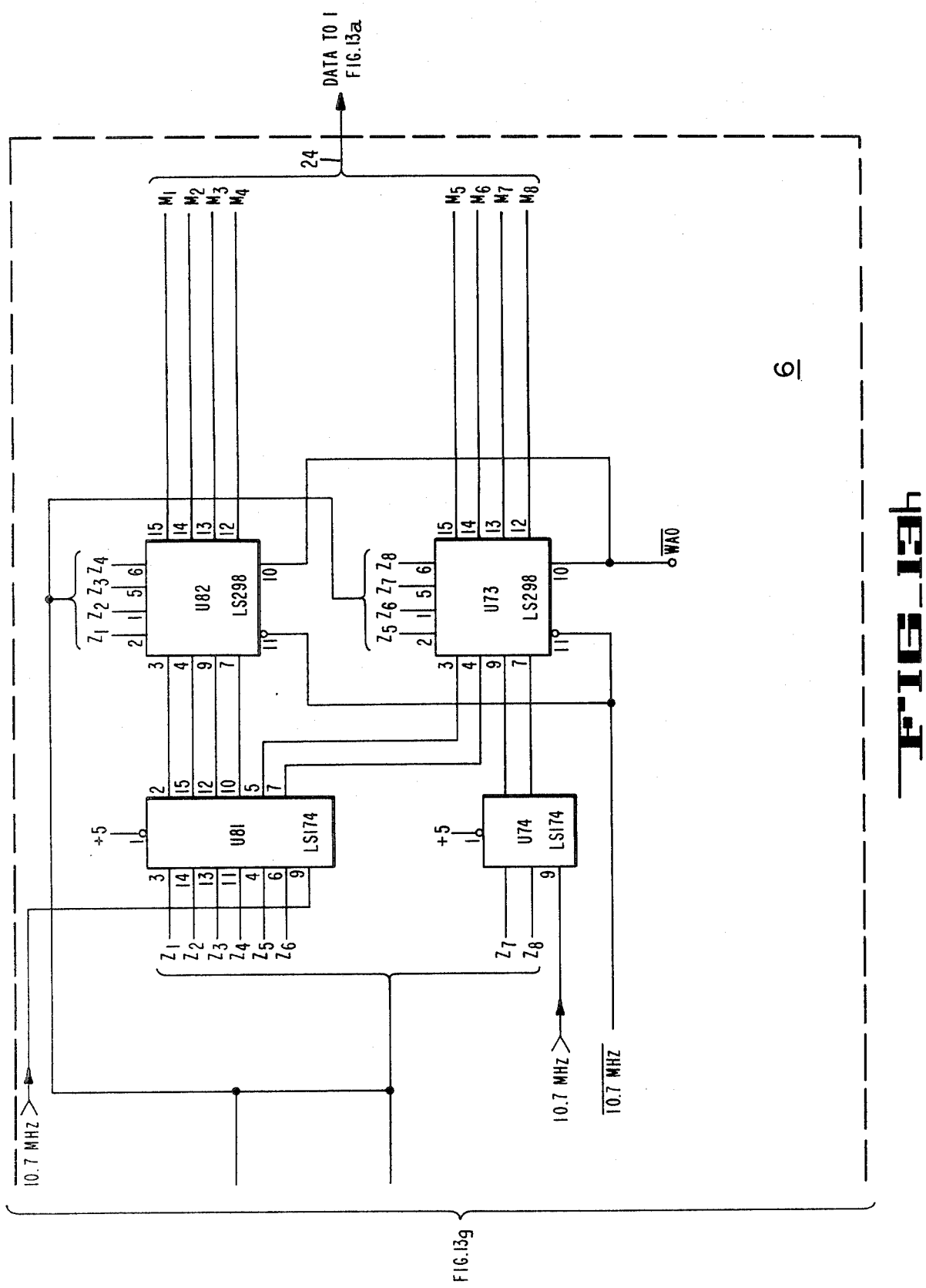

Preferred embodiments of the filter of the present invention will be described, followed by the description of examples of the utilization of the filter in systems for processing digital composite signals.

The filter of the present invention is a type of digital comb filter constructed to process a digital type composite information signal including two or more frequency components. By the filter of the present invention, one or more selected components of the composite information signal are eliminated by filtering. For simplicity of description, the composite information signal is referred to herein as the composite signal. The digital type signal to be processed may be obtained, for example, by sampling a composite analog signal utilizing a sampling clock signal which is frequency and phase-locked to the selected frequency component or components, to be filtered, as will be described hereinbelow. Digital representations of the samples are generated by a quantizer that receives each sample representing a discrete amplitude value of the composite analog signal and converts or encodes it into a suitable digital code, such as an NRZ code. These digital representations of the samples are combined in the filter of the present invention in such a manner that one or more selected periodic symmetrical signal components, each having a known nominal frequency, are eliminated from the composite signal. More specifically, the filter of the present invention receives and stores for a selected interval consecutive samples representing the composite signal from which one or more periodic signal components are to be removed by the filter. The filter continuously combines a selected number of the received samples to provide a digital average representation of the values of the combined samples which define a zero average value of the selected periodic signal component or components.

The filter comprises a combination of digital storage devices, such as delays, and arithmetic circuitry arranged and operated to provide at the filter's output for each digitized sample received at the filter's input a digital average representation of the values of a selected number of received samples. The number of samples averaged is selected to define a time interval which provides a zero average value of the portion of the averaged digital sample representations corresponding to the signal component to be eliminated from the composite signal by the filter. The operation of the combination of digital storage and arithmetic means for processing the received digitized samples to obtain a running digital average representation of the values thereof is controlled by a clock signal that has a frequency which is synchronized and equal to the frequency at which the samples are received by the filter. As will become more apparent from the following description, an important feature of the present invention is the capability of the filter to filter out or eliminate selected signal components from digitized samples of a composite signal transmitted to the filter at an unpredictable and randomly varying rate. In such applications of the present invention, the frequency of the filter's clock signal must vary synchronously with the varying rate of receipt of the digitized samples by the filter. Of course, a stable frequency clock signal is provided to the filter in those applications where the digitized samples are received by the filter at a stable rate.

FIG. 1 illustrates an embodiment of the filter of the invention arranged to filter a selected 3.58 MHz chrominance signal component from a composite analog NTSC color television signal. Typically, the composite color television signal is an analog signal, often containing randomly varying time base errors. In accordance with the present invention, the analog signal first is converted to a binary coded digital signal and then is passed through the signal delays and arithmetic circuitry to remove the selected frequency component. More specifically, the analog composite color television signal received at an input terminal 80 is coupled to an input of a video signal processor 81. The signal processor 81 is a conventional arrangement of circuitry found in color television signal processing systems, such as time base correctors, that amplifies the received signal, provides D.C. restoration and separates the vertical field and horizontal line synchronizing components (vertical and horizontal sync) as well as the color burst synchronizing component, respectively, from the composite signal. The above-indicated respective synchronizing components are then further utilized in the following signal processing for synchronization purposes. The analog composite signal obtained at the output of the signal processor 81 is coupled to an input of an analog-to-digital (A/D) converter 82 which encodes or converts the analog signal to a binary coded signal. In one preferred embodiment, an A/D converter 82 is employed in which the composite analog NTSC television signal is sampled at a rate of three times the subcarrier signal frequency, that is, 3 > 3.58 MHz or approximately 10.7 MHz. Each sample is digitally quantized into an NRZ digital word composed of 8 parallel bits. In accordance with the present invention, a 10.7 MHz sampling clock signal that is substantially coherent with the 3.58 MHz chrominance signal component to be filtered from the composite television signal is employed to clock the A/D converter 82 to effect the sampling and quantizing of the composite analog television signal. The 10.7 MHz clock signal is generated by a sampling clock signal generator 83 from the color burst, horizontal line and vertical field synchronizing components obtained from a television synchronizing signal separator included in the signal processor 81. While small phase variations may be present in the horizontal line of video information following the color burst interval due to velocity errors and the like, particularly, when such signals are obtained from video recorder television signal sources, such variations are so small that they can be disregarded and the 10.7 MHz clock signal can be considered coherent with the 3.58 MHz chrominance signal component for purposes of the invention described herein. Some television signals contain a continuously available pilot signal. In those cases, the pilot signal may be used to generate a 10.7 MHz clock signal that is truly coherent with the 3.58 MHz chrominance signal component.

The A/D converter 82 responds to the 10.7 MHz clock signal provided at its clock input terminal by the clock signal generator 83 and a clamp control signal provided at its clamp control input terminal by the signal processor 81 to provide at the output of A/D converter 82 the NRZ digital words representative of the input analog television signal. The 8-bit NRZ digital words provided by the A/D converter 82 are applied over eight parallel lines 84 to the filter circuit 2.

The circuit details of the signal processor 81, A/D converter 82 and clock signal generator 83 are not shown or described herein as they are identical in their design and operation as those incorporated in the Ampex Corporation TBC-1 digital time base corrector. More specifically, the schematic diagrams of those circuits are shown in the catalog number 1809274-02 published by Ampex Corporation in November, 1977. The specific circuitry for the signal processor 81 is shown in schematic drawing No. 1406103A appearing on page 29/30; the A/D converter 82 is shown in schematic drawing Nos. 1402409B and 1401312, respectively, appearing on pages 37/38 and 43/44, respectively; and the clock signal generator 83 is shown in schematic drawing No. 1402337 appearing on pages 49/50 and 51/52.

If the digitized television signal is coupled directly from the A/D converter 82 to the input of the filter 2 without further alteration of the data rate, as in the embodiment illustrated by FIGS. 1, 2, or 5, the 10.7 MHz clock signal generated by the clock signal generator 83 is also coupled to the filter 2 to clock the filter's circuit elements or means utilized in the processing of the composite digitized television signal to remove the selected periodic signal component. However, if a reclocking or buffer circuit means (not shown) is placed in the signal path between the A/D converter 82 and the filter 2 to alter the data rate of the digitized television signal before coupling it to the filter, for example, as would be necessary to synchronize an unstable digitized signal to a frequency stable reference, a corresponding frequency stable reference clock signal would be employed to clock the filter's circuit elements. Of course, the frequency stable reference clock signal would be generated to have the same frequency and synchronous relationship relative to the reclocked selected periodic signal component as described hereinabove.

The 8-bit digital word output signal from the analog-to-digital converter 82 is applied to an input of the filter circuit 2 of the invention via connecting line 85. Generally, the filter circuit 2 of the invention coprises a cooperative combination of circuit elements, which in the preferred embodiment of FIG. 1 are shown as delay means 84, signal combiner means 86 and signal divider means 87. As it will be described in more detail hereinbelow, the filter circuit 2 receives consecutive digital samples from the above-indicated A/D converter and delays and combines them to provide a digital average representation of the values of the combined samples by processing a selected number of samples representing the analog color television signal received at the input terminal 80. The number of digital samples combined to provide the digital average representation is selected with respect to the relationship between the clock signal frequency and frequency of the selected signal component to be eliminated by the filter in such a manner that the digital average representation at the output of the filter represents an average signal value of the composite signal and, at the same time, a zero average value of the selected frequency component.

Now, the operation of the filter circuit 2 of FIG. 1 will be described in general, followed by the description of the specific preferred embodiments shown in FIGS. 2 and 5, respectively. The delay means 85 receives the consecutive digitized samples from the A/D converter 82, and it delays or stores each sample for a predetermined number of sample intervals so that a selected number of received samples are simultaneously accessable for arithmetic combination. In the preferred embodiments of the filter circuit 2, the delay means includes a plurality of parallel signal transmission paths having signal delay elements that provide different transmission times between the input and output of the delay means for each received sample so that the selected number of different received samples are simultaneously provided to the signal combiner means 86. The selected number of delayed samples transmitted through the delay means 85 are applied via respective connecting lines 89 to associated inputs of the signal combiner means 86. The signal combiner means arithmetically combines selected samples and provides at its output a digital representation of the value of the combined samples. The digital representation is applied to an input of the signal divider means 87 via connecting line 90. The signal divider means 87 divides the combined sample value to provide at its output 91 a digital average representation of the values of the combined samples. The number of samples combined, the arithmetic combinational factor and the divisor are selected so that the signal provided at the output 91 of the filter circuit 2 is a digital average representation of the values of the combined samples that defines a zero average value of the selected frequency component. In this manner, the selected frequency component is eliminated from the composite signal by the filter circuit 2. Now, preferred embodiments of the filter circuit 2 shown in FIGS. 2 and 5 will be described.

The filter circuit of FIG. 2 provides a digital average representation of the values of three consecutive digital sample representations, $S_1$, $S_2$, $S_3$, received in succession from, for example, an A/D converter, such as shown in FIG. 1. The filter circuit of FIG. 2 utilizes cascade combination of digital devices, including registers, binary adders and a divider, arranged to form three parallel transmission paths of different transmission times for each of the received samples. Each consecutive sample generated by the A/D converter 82 shown in FIG. 1 is coupled by the eight parallel connecting lines 84 to an input of a clocked register 49, which serves as a timing buffer between the A/D converter 82 and the filter circuit 2. The propagation of the 8-bit digital word samples through the register 49, as well as through other clocked devices of the filter circuit 2, is controlled by the 10.7 MHz clock signal generated by the clock signal generator 83 (FIG. 1) and provided over connecting line 88. The output of the register 49 is coupled by lines I to an input of a clocked register 50 and a first input of an adder 51. Register 50 is clocked by the 10.7 MHz clock signal to receive the consecutive samples $S_1$, $S_2$, $S_3$, etc., coupled to its input by the clocked register 49 and delays each received sample by one clock cycle relative to the time the sample appears on lines I coupling the output of the register 49 to the input of register 50. The output of register 50 is coupled by connecting lines II to a second input of the adder 51. Adder 51 is an arithmetic device of the type that provides at its output coupled to connecting lines III the sum of its inputs received over lines I and II. Therefore, adder 51 adds each one clock cycle delayed sample received from the register 50 to the next consecutive sample received from register 49 to provide a running sum of two consecutive samples output by the A/D converter 82. Another clocked register 52 has its input coupled to the output of the adder 51 by the connecting lines III and is clocked by the 10.7 MHz clock signal present on line 88 to receive sum of two consecutive samples provided by the adder 51. Like registers 49 and 50, the register 52 provides a delay of one clock cycle for each sample sum received from the adder 51. The output of the register 52 is coupled by connecting lines IV to a second input of an adder 53, which adder has its first input coupled by lines I to receive the consecutive samples from register 49. Adder 53 provides on connecting lines V coupled to its output the sum of its inputs received over connecting lines I and IV. Therefore, a running sum of three consecutive samples provided by the A/D converter 82 through register 49 is present at the lines V coupled to the output of the adder 53. A clocked divider 57 has its input coupled to the output V of adder 43 via a preceding register 54 and it provides a division by three of the received sum of three consecutive samples. The register 54 immediately preceding the divider 57 (or register 56 in the filter circuit embodiment arranged to average four consecutive samples) is utilized to reclock the bits forming each average 8-bit digital word and, thereby, remove any bit skewing or transients that may be present in the averaged 8-bit digital word. Bit skewing is caused by small differences in the propagation delays experienced by the individual bits of each 8-bit digital word as they are processed in parallel through the filter circuit. Transients are generated by active circuit elements that immediately transmit to their outputs without clocking the results of signal state changes at their inputs. The adders employed in the preferred embodiment of the filter circuit 2 are examples of such circuit elements in that they are the kind in which changes in the logic level of the signals at their inputs are immediately transmitted to their output. The registers 49, 50 and 52 also perform a reclocking function. Should the bit skewing and transients be tolerable or absent, the reclocking register immediately preceding the divider 57 can be eliminated from the filter circuit 2.

Each of the registers and the divider of the filter circuit delays the data received at its input by one clock cycle. This delay results from the clocking of the registers and dividers because the digital sample representations present at their inputs do not appear at their outputs until after the devices have been clocked by the 10.7 MHz clock signal. As a result of such clocking, each sample proceeds along the series circuit paths defined by the register and divider devices only in steps of one device per clock cycle.

In the filter circuit 2, the connecting lines I at its input branch into three different signal transmission paths to the output 91 of the filter circuit. The signal transmission times through the three paths differ by integral multiples of the period of the 10.7 MHz clock signal, with the transmission time through the longest signal transmission path being two clock signal periods longer than the transmission time through the shortest signal transmission path and the transmission time through the signal transmission path of intermediate length being one clock signal period longer than the transmission time through the shortest signal transmission path. The shortest signal transmission path between the connecting lines I and the output 91 of the filter circuit 2 includes the binary adder 53 followed by the register 54 and the divider 57. The register 54 and the divider 57, respectively, introduce a propagation delay of one clock signal cycle each in the signal transmission path. Consequently, the shortest signal transmission path has an overall signal transmission delay of two clock signal cycles. Adder 53, register 54 and divider 57 are common to the three signal transmission paths. Therefore, the aforementioned differences in the transmission times through the three paths must be established before the adder 53.

The portion of the signal transmission path of intermediate length between connecting lines I and the adder 53 includes another binary adder 51 followed by the register 52. As described hereinabove, the register 52 introduces a propagation delay of one clock signal cycle in the signal transmission path. Consequently, the signal transmission path of intermediate length provides a signal transmission delay between lines I and the connecting lines IV coupled to the second input of the adder 53 of one clock signal cycle, which is one cycle longer than the delay through the portion of the shortest signal transmission path between the lines I and the input to the adder 53. Thus, at the same time that register 52 provides data at the second input of the adder 53, a sample that was generated one sample interval or clock period earlier by the A/D converter 82 of FIG. 1 is provided at the first input of the adder 53 over connecting lines I.

The longest signal transmission path is formed in part by the signal transmission path of intermediate length, i.e., the path from adder 51 to divider 57 and in part by register 50. Since the register 50 introduces a propagation delay of one clock signal cycle in the transmission path, the signal transmission delay between the lines I and the connecting lines II coupled to the second input of the adder 51 is one clock signal cycle, which is one cycle longer than the signal transmission delay through the transmission path of intermediate length. Thus, at the same time that a sample is coupled by lines I to the first input of the adder 51, a sample generated one sample interval or clock signal periods earlier by the A/D converter 82 of FIG. 1 is provided at the second input of the adder by the register 50. Therefore, the longest signal transmission path provides a signal transmission delay between lines I and the output of the filter circuit 2 that is two clock signal cycles longer than that provided by the shortest signal transmission path.

The filter circuit illustrated by FIG. 2 provides an average of three consecutive samples. If it is desired to provide, for example, an average of four consecutive samples, an additional adder 55 and clocked register 56 are added to the filter circuit 2, coupled in cascade between register 54 and divider 57, as shown by dashed lines. In this modified filter circuit, the divider 57 is a divide-by-four divider. For each additional sample averaged, an additional adder and register are coupled in the filter circuit of FIG. 2, preceding the divider 57 in the above-described manner, and the divider is implemented accordingly. All the above digital devices are commercially available conventional devices, as will be appreciated upon consideration of the detailed circuit diagram of FIGS. 13a to 13h. The operation of the filter circuit of FIG. 2 will be described now with respect to particular circuit locations indicated I, II, III, etc., and as indicated in TAB. 1 below.

TABLE 1

| Clock Time | Location | | | | | | |
|---|---|---|---|---|---|---|---|
| | I | II | III | IV | V | VI | VII |
| 1 | $S_1$ | | | | | | |
| 2 | $S_2$ | $S_1$ | $S_1 + S_2$ | | | | |
| 3 | $S_3$ | $S_2$ | $S_2 + S_3$ | $S_1 + S_2$ | $S_1 + S_2 + S_3$ | | |
| 4 | $S_4$ | $S_3$ | $S_3 + S_4$ | $S_2 + S_3$ | $S_2 + S_3 + S_4$ | $S_1 + S_2 + S_3$ | |
| 5 | $S_5$ | $S_4$ | $S_4 + S_5$ | $S_3 + S_4$ | $S_3 + S_4 + S_5$ | $S_2 + S_3 + S_4$ | $\frac{1}{3}(S_1 + S_2 + S_3)$ |

As shown in TAB. 1, each consecutive sample clocked to the output of the register 49 is received simultaneously over lines I at respective inputs of register 50, first adder 51 and second adder 53, as well as any further adder, such as 55, present in the circuit. At a first clock time 1, register 49 is clocked to place sample $S_1$ at its output, which is coupled by lines I to the input of the register 50 and first input of each of the adders 51, 53. Because of the clocking of register 49, sample $S_1$ does not appear at its output on lines I, hence, at the inputs of the adders 51, 53 and register 50, until after the clocking of the registers and dividers. Consequently, sample $S_1$ is not clocked at this time through register 50 to the connecting lines II extending to the second input of the adder 51. Each adder 51, 53, however, immediately responds to the receipt of a new digital sample representation at its input, such as the appearance of sample $S_1$ on lines I, to couple to its output the sum of the new digital sample representations at its inputs. While the sample $S_1$ is present in the summed outputs of adders 51 and 53, such presence occurs after the clocking of the following registers 52 and 54; and, therefore, the sample $S_1$ is not clocked through the register 52 and 54 during clock time 1.

At the next clock time 2, sample $S_2$ is present at the input of register 49. Each of the registers 49, 50, 52, 54 and divider 57 is clocked to effect the transmission to their respective outputs of the data then present at their respective inputs, which occurs an interval after the onset of the clocking. As a result of the clocking, sample $S_2$ appears at the output of register 49, hence, on lines I extending to the inputs of the adders 51, 53 and register 50; register 50 transmits the previous sample $S_1$ from its input to its output, hence, connecting lines II extending to the second input of the adder 51; the summed samples appearing on connecting lines III coupled to the input of register 52 are transmitted to the output of the register and placed on connecting lines IV extending to a second input of the adder 53; the summed samples appearing on connecting lines V coupled to the input of register 54 are transmitted to the output of the register and placed on connecting lines VI extending to the input of the divider 57; and the summed samples appearing on connecting lines VI coupled to the input of the divider 57 are divided by three and the divided output is transmitted to the divider's output and placed on connecting lines VII. Following the aforedescribed clocking of the registers and divider, both adders 51 and 53 provide the new sample sum on lines III and V respectively coupled to the outputs of adders.

At the next clock time 3, sample $S_3$ is present at the input of the register 49 and the registers and divider are clocked to transmit the sample sum then present at their respective inputs. As a result, adder 51 receives sample $S_2$ from the clocked register 50 and sample $S_3$ over lines I from the clocked register 49 and responsively provides the sample sum $S_2+S_3$ on lines III connected to its output. Adder 53 receives the sample sum $S_1+S_2$ over lines IV from the clocked register 52 and the sample $S_3$ over lines I from the clocked register 49 and responsively provides the sample sum $S_1+S_2+S_3$ on lines V connected to its output. Clocked register 54 transmits the sample sum previously provided at the output of the adder 53 to lines VI connected to its output and the clocked divider transmits the divided sample sum to lines VII connected to its output.

At the next clock time 4, sample $S_4$ is present at the input of the register 49 and the registers and divider are again clocked to transmit the sample sum then present at their respective inputs. As a result of this clocking, adder 51 receives sample $S_3$ over lines II from the clocked register 50 and sample $S_4$ over lines I from the clocked register 49 and responsively provides the sample sum $S_3+S_4$ on lines III connected to its output. Adder 53 receives the sample sum $S_2+S_3$ over lines IV from the clocked register 52 and the sample $S_4$ over lines I from the clocked register 49 and responsively provides the sample sum $S_2+S_3+S_4$ on lines V connected to its output. Clocked register 49 transmits the sample sum $S_1+S_2+S_3$ on lines VI connected to its output and the clocked divider transmits the divided sample sum previously provided by the register 54 to lines VII connected to its output.

At the next clock time 5, sample $S_5$ is present at the input of the register 49 and the registers and divider are again clocked to transmit the sample sum then present at their respective inputs. In the manner described hereinbefore with respect to previously received samples, adder 51 places the sample sum $S_4+S_5$ on the lines III coupled to its output, adder 53 places the sample sum $S_3+S_4+S_5$ on lines V coupled to its output, register 54 transmits the sample sum $S_2+S_3+S_4$ to the lines VI coupled to its output and divider 57 transmits the divided sample sum $\frac{1}{3}(S_1+S_2+S_3)$ to the lines VII coupled to its output, the digital representation of the average values of three consecutive samples. For each subsequent 8-bit digital word sample received over lines 84 from the A/D converter 82, the adders, registers and divider cooperate to provide on lines VII, connected to the output of the divider 57, the digital average representation of the values of each next three consecutive samples, whereby a running digital average representation of the values of three consecutive samples of the signal received at the input of filter circuit 2 is provided at the output 91 of the filter circuit.

To illustrate the manner in which the foregoing operation of the filter circuit shown in FIG. 2 eliminates a selected periodic frequency component of the composite analog signal, reference is directed to FIG. 3a. The periodic frequency component to be eliminated, represented as sine wave of amplitude v at frequency f, is sampled at a frequency 3f by a clock signal that is in phase with the periodic signal component. According to the well-known Nyquist sampling theorem, the sampling frequency should be higher than twice the highest frequency of the sampled composite signal bandwidth. The sampling points on wave v are designated $V_1$, $V_2$, $V_3$, $V_4$, etc., and are 120 degrees apart. Each sampling point $V_n$ represents a particular amplitude value of the sine wave. In this example, a running average voltage value $L_n$ is obtained for each consecutive sample received by the filter by averaging the combined amplitudes of three consecutive samples. For filter embodiments that are constructed and operate to provide an average value output for each received sample by averaging each sample with a given number of its immediately preceding and succeeding samples, the average value, L, of each sample, V, is given by the equation:

$$L_n = \frac{1}{n}(V_1 + V_2 \ldots + V_n) \quad (1)$$

where n is a known integral number of the samples averaged. Specifically, when averaging three consecutive samples:

$$L_3 = \tfrac{1}{3}(V_1+V_2+V_3) \quad (2)$$

Because of the symmetrical properties of sine wave signals with respect to a signal crossing D.C. axis, any average value $L_n$ obtained by averaging n consecutive samples which define an integral number of signal cycles as described above with respect to equation (1) will be zero. This is true for any integral number of averaged samples, greater than two per sine wave period and regardless of the phase points at which the sine wave is sampled, i.e., phase relationship between the sine wave and sampling clock signal.

Furthermore, because the sampling signal or clock signal employed to control the arithmetic operations performed by the filter is, at the input to the filter, frequency and phase-locked to the periodic signal component to be separated or eliminated by the filter of the present invention, the filter may be utilized, for example, to separate or eliminate signal components from a composite signal having time base errors, such as resulting from a magnetic recording and reproducing process.

An example of sampling a sine wave w of frequency f utilizing a sampling clock signal having an arbitrary phase relationship thereto, is shown in FIG. 3b. Equispaced sampling points 1, 2, 3 and 4 of frequency 3f are shown displaced by T/3=120 degrees with respect to the sine wave period T=360 degrees. There is an arbitrary phase difference between the wave, w, and the sampling clock signal, represented by sampled points 1, 2, 3, 4, etc. The sine wave w maybe generally defined as:

$$w(t) = A \sin(B-C) \tag{3}$$

where C is the arbitrary phase difference between the sine wave w and the sampling signal, and A is the amplitude.

Equation (3) may be further defined as:

$$A \sin(B-C) = A_1 \cos B + A_2 \sin B \tag{4}$$

$$A_1 = -\sin C \tag{5}$$

$$A_2 = \cos C \tag{6}$$

When substituting particular amplitude and phase angle values for $A_1$, $A_2$, and cos C and sin C, respectively, into the above equations (3) to (6), the sum of any three consecutive samples equals zero, and, thus, any average sample value $L_n$ as indicated in (1) also will be zero. The zero average values are plotted as $L_1$, $L_2$, $L_3$, etc., in FIG. 3a and as 1', 2', 3', etc., in FIG. 3b. It is seen from both FIGS. 3a and 3b that a full cycle of the selected signal component of the kind defined by equations (2) and (3) has equal and identical portions extending above and below a signal crossing D. C. axis. Consequently, the average D. C. value of that signal component is zero. An integral number, n, of samples which define a time interval equal to an integral number, N, of one or more cycles of the selected periodic signal component to be eliminated by the filter circuit 2 comprise an equal number of "positive" and "negative" value samples whose average value, $L_n$, equals zero, that is, the summation of the values of samples from above the D. C. axis is cancelled by the summation of the values of the samples from below the D. C. axis. In other words, an integral number of samples defining one or more integral cycles of the selected signal component have complementary amplitude levels above and below a signal crossing axis, which yield a zero average value. This is true regardless of the phase points at which the signal component waveform is sampled, as it follows from the foregoing description.

The filter of the present invention is a type of comb filter which eliminates signals having frequencies coinciding with the notch frequencies defined by the filter's response characteristic, such as illustrated in FIG. 4. The filter can be constructed and operated to remove any one or more harmonically related signal components included in the digitized composite signal coupled to its input, with the number of harmonically related signal components removed depending upon the frequency of digitized samples at the input of the filter and the number of samples averaged by the filter to generate the running average value output. The lowest order signal component removed by the filter of the present invention is defined as having a frequency $$f_{min} = \frac{f_{sampl}}{n} \tag{7}$$

where $f_{sampl}$ is the sampling clock frequency defined in equation (1); and n is the number of samples taken for averaging as defined in equation (1). The diagram shown in FIG. 4 depicts the frequency components eliminated by the filter of the present invention. As it is seen, the filter of the invention has a first notch at a frequency $f_{min}$ defined by equation (7) and it has further notches at higher intergral multiple frequencies of $f_{min}$. Consequently, the highest order signal component removed by the filter is one having frequency equal to an integral multiple of the lowest removed component $f_{min}$ and which is contained within the frequency band of the filtered composite signal. However, in applications where it is desirable to remove only a specific selected frequency component from a wideband composite signal, the sampling frequency $f_{sampl}$ (or filter's clock signal frequency) is selected such that the frequency of any other component included in the composite signal does not coincide with the notch frequencies of the filter.

In the embodiment of the filter circuit 2 illustrated in FIG. 2, the sampling clock frequency and filter's clock frequency have been chosen as an integral multiple of the selected frequency component to be removed. However, the filter circuit 2 can be modified to process digital sample representations provided at a sampling frequency which is a rational fractional multiple of the selected frequency component to be eliminated from the composite signal; a sampling frequency equal to 2.5 times the selected signal component frequency being selected as an illustration of this embodiment. With such a sampling frequency, two and one-half samples are obtained for each cycle of the selected periodic signal component and five samples are obtained over two full signal component cycles, as shown in FIG. 5. To obtain an average sample value defining a zero value for the selected periodic signal component, a running average sample representation is generated of the values of n=5 consecutive samples.

To provide a running digital average representation of the values of five consecutive samples generated at a rate of 2.5 times the selected frequency component to be eliminated from the composite signal, the filter circuit 2 of FIG. 2 is modified to include two additional parallel signal transmission paths between the connecting lines I and the input of the divider 57. The first of the additional paths includes the connecting lines I, the adder 55 and the clocked register 56 illustrated by dotted lines in FIG. 2. The second of the additional paths is formed by an additional parallel path extension of the connecting lines I and another cascaded combination of an adder and clocked register (none of which are shown in FIG. 2). The additional adder has one input coupled to receive the summed samples from the register 56 and a second input coupled to receive consecutive samples from the parallel extension of the connecting lines I. The additional register is coupled between the output of the additional adder and the input of the divider 57 and performs the above described reclocking function. With the two additional parallel signal transmission paths, the modified filter circuit 2 has five parallel signal transmission paths between the connecting line I and the input of the divider 57, respectively providing signal transmission times differing by 1 through 5 clock signal periods whereby five consecutive samples can be arithmetically combined for averaging.

Besides adding the two additional parallel signal transmission paths to the filter circuit, the divider 57 is modified to divide the combined samples by a factor of five. Also, all clocked registers and dividers are adapted to be clocked by a clock signal coupled by line 88 to their respective clock inputs having a frequency of 2.5 times the selected frequency component to be eliminated from the component signal.

Summing five consecutive samples and dividing the obtained value by 5 provides an average representation of the values of the five consecutive samples which defines a zero value of the selected periodic signal component. However, in this modified embodiment of the filter circuit 2, a frequency component equal to one-half of the frequency component of the composite signal also will be eliminated. For example, for a selected signal component of frequency $f_{sig} = 3.58$ MHz, such as the standard chrominance subcarrier signal component included in the NTSC color television signal, and for the sampling frequency $f_{sampl}$ equal to two and one-half times the subcarrier signal frequency, i.e., $f_{sampl} = 2.5 \times 3.58 = 8.95$ MHz. The lowest frequency component removed by the modified filter circuit, as given by equation (7) is $f_{min} = 8.95$ MHz$/5 = 1.79$ MHz. If it is undesirable to remove the 1.79 MHz component in addition to the 3.58 MHz chrominance component from the color television signal, a different sampling frequency should be selected, such as the previously described $f_{sampl} = 3 f_{sig}$. Removal of the 1.79 MHz component of a color television signal may undesirably degrade the signal. In the previously described unmodified embodiment of the filter circuit 2 illustrated by FIG. 2, $f_{min}$ equals 3.58 MHz, which is the lowest frequency component removed by the filter. As it has been explained above, and illustrated in FIG. 4, integral multiples of the lowest frequency component removed by the filter corresponding to higher order harmonics also will be removed by the filter.

The filter of the invention can be constructed and operated to average either an even number or an odd number of input samples to generate at its output the digital average representation for each received input sample. However, averaging an odd number of input samples facilitates the avoidance of the introduction of undesirable phase shifts to the digital average representation provided by the filter. Averaging an odd number of the input samples permits substituting in place of each of input sample value a representation in the form of a digital representation of the average of the value of the input sample plus the values of equal numbers of input samples occurring before and after the input sample. Averaging an even number of input samples to generate the digital average representation does not permit generating the representation from equal numbers of input samples occurring before and after the input sample to be substituted by the representation. As a result, some phase displacement occurs when averaging an even number of input samples. The phase displacement can be limited to one-half of the interval between consecutive samples, or sampling period, if the digital average representation generated from a sequence of an even number of input samples is substituted for an input sample occurring nearest the middle of the sequence. Since such phase displacement is constant for all substituted sample values, no objectionable phase distortion results. However, in some signal processing applications, such as color television signal dropout compensators, such fractional phase displacments are undesirable because they complicate the processing of the signal for use in alleviating dropouts that often occur in television signals reproduced from a magnetic recording.

When utilizing the filter of the above-described invention as a low-pass filter, it is preferable to have a relatively low integral number of samples per cycle of the selected periodic signal to avoid high sampling signal frequencies while maintaining the shortest possible signal period for averaging. A sampling rate of three times the frequency of the selected periodic signal to be eliminated by the filter satisfies these preferred conditions. Such sampling rate has the further advantage of facilitating the avoidance of the introduction of the aforementioned undesirable phase shifts because an odd number of input samples can be conveniently averaged to generate the digital average representation for each input sample.

A filter constructed in accordance with the embodiment illustrated in FIG. 2 and operated to provide a running average sample value representation of a composite signal sampled at a frequency equal to an even number multiple of the signal component to be eliminated by the filter will introduce the aforedescribed phase displacement. However, the embodiment of the present invention shown in FIG. 6 avoids introducing a phase displacement in the running average sample value representation of a composite signal sampled at such even number multiple frequency. Generally, the filter embodiment of FIG. 6 avoids the introduction of a phase displacement by generating an average sample value representation of each sample from selected ones of a sequence of input samples which are weighted for averaging. That filter embodiment and the manner in which it operates to generate the desired average sample value representation are described in detail hereinbelow.

To obtain a zero average value of a selected periodic signal, a weighted average value signal may be provided, for example, by assigning selected respective weighting coefficients to respective inputs of the various circuit elements utilized in the filter of the present invention. The foregoing may be implemented by coupling digital multipliers 70 to 75, indicated by dashed lines in FIG. 2, to the respective inputs of adders 51, 53, 55. For example, digital multipliers TDC 10085 manufactured by T.R.W. Corporation may be utilized. Alternatively, if the samples being summed are weighted by coefficients of powers of 2, i.e., $\frac{1}{4}, \frac{1}{2}, 1, 2, 4$, etc., to obtain the averaged sample value representation, the weighting of the samples can be accomplished conveniently by bit shifting the 8-bit digital word sample at the inputs of the adders the appropriate number of bit positions and in the appropriate direction corresponding to the weighting coefficient. Such bit shifting is effected in the well known manner of coupling the input bit lines to lower or higher order binary bit position inputs of the adders. For example, to multiply the sample by 4, each input bit line is coupled to a bit position input of the adder which is two bit position orders higher than the bit position order of the input bit line. To multiply the sample by $\frac{1}{4}$ (or divide by 4), each input bit line is coupled to a bit position input of the adder which is two bit position orders lower than the bit position order of the input bit line.

The foregoing will be explained with reference to FIGS. 6 and 7 respectively depicting the block diagram of an alternative embodiment of the digital filter of the present invention and the operation thereof. FIG. 7 shows a sine wave of amplitude Z at frequency f sampled at a frequency 4f. The sampling points on waveform Z are designated $Z_1$, $Z_2$, $Z_3$, etc., and are 90 degrees apart. An average sample value of the sine wave Z is obtained by generating a weighted average sample value of five consecutive samples in accordance with the following equation:

$$M_n = \tfrac{1}{2}Z_n + \tfrac{1}{4}(Z_{n-2} + Z_{n+2}) + 0\,(Z_{n-1} + Z_{n+1}) = 0 \quad (8)$$

For example, an average sample value $M_4$ substituted for sample $Z_4$ is:

$$M_4 = \tfrac{1}{2}Z_4 + \tfrac{1}{4}(Z_2 + Z_6) + 0\,(Z_3 + Z_5) = 0 \quad (9)$$

To generate the weighted average value of the five consecutive samples in accordance with equation (8), digital weighting means are arranged in circuit with digital time delay and digital arithmetic devices to weight the five consecutive samples by weighting coefficients as follows: $Z_n$ is weighted by "$\tfrac{1}{2}$"; both $Z_{n-2}$ and $Z_{n+2}$ are weighted by "$\tfrac{1}{4}$"; and both $Z_{n-1}$ and $Z_{n+1}$ are weighted by "0"→As illustrated by FIG. 7 and the above equations (8) and (9), appropriately selected weighting of consecutive samples enables a selected periodic signal component Z to be eliminated from a composite signal sampled at a frequency equal to an even number multiple of the frequency of the selected periodic signal without introducing a phase displacement to the resulting composite signal. Introduction of a phase displacement is avoided because each generated average sample value is substituted for a sample that occurs in the middle of the sequence of consecutive sample that are averaged.

A block diagram in FIG. 6 shows an embodiment of the filter circuit 2' of the present invention as arranged to generate and substitute an average sample value for each input sample in accordance with equation (8). To facilitate the description, the operation of the circuit of FIG. 6 is indicated in TAB. 2 below, depicting the propagation of consecutively received samples $Z_1$, $Z_2$, $Z_3$. etc., at clock signal times 1, 2, 3, etc., with respect to particular locations A, B, C, etc., in the block diagram of FIG. 6.

A/D converter 82 of FIG. 1 is coupled by the connecting lines 84 to the input of the timing buffer register 49. Upon the occurrence of each clock signal of the 10.7 MHz sampling signal at the clock input 88 of the register 49, an 8-bit digital word sample is transmitted from the input of the register 49 to its output coupled to the eight parallel connecting lines A. The connecting lines A branch into three different signal transmission paths to the output 91 of the filter circuit 2'. The transmission paths include signal delay elements or means that provide different transmission times for each sample through the different signal transmission paths. In the embodiment of the filter circuit 2' illustrated by FIG. 6, the transmission times differ by even multiples of the period of the 14.32 MHz sampling signal, with the transmission time through the longest signal transmission path being four sampling signal periods longer than the transmission time through the shortest signal transmission path and the transmission time through the signal transmission path of intermediate length being two sampling signal periods longer than the transmission time through the shortest signal transmission path. As will become more apparent upon consideration of the more detailed description of the filter circuit 2' hereinbelow, the even multiple sampling signal period relationship of the transmission times of the three transmission paths creates the "0" weighting coefficients specified in equation (8) because only every other sample of each sequence of five consecutive samples are combined to form the weighted average sample value representation at the output 91 of the filter circuit 2'.

The shortest signal transmission path between connecting lines A and the output 91 of the filter circuit 2' includes a binary adder 65 coupled at its first input to the lines A extending from the buffer register 49 and followed by a binary divider 66. The divider is responsive to the 10.7 MHz sampling signal coupled by lines 88 to its clock input to divide the binary signal at its input by a factor of two. As described hereinbefore with reference to the embodiment of the filter circuit illustrated in FIG. 2, such dividers introduce a propagation delay of one sampling signal cycle in the signal transmission path. Consequently, the shortest signal transmission path has an overall signal transmission delay of one sampling signal cycle, with the delay located in the transmission path so that a sample appearing on the

TAB. 2

| Clock Time | A | B | C | D | E | F | G | H |
|---|---|---|---|---|---|---|---|---|
| 1 | $Z_1$ | | | | | | | |
| 2 | $Z_2$ | $Z_1$ | | | | | | |
| 3 | $Z_3$ | $Z_2$ | $Z_1$ | $Z_3 + \tfrac{Z_1}{2}$ | | | | |
| 4 | $Z_4$ | $Z_3$ | $Z_2$ | $Z_4 + \tfrac{Z_2}{2}$ | $Z_3 + \tfrac{Z_1}{2}$ | | | |
| 5 | $Z_5$ | $Z_4$ | $Z_3$ | $Z_5 + \tfrac{Z_3}{2}$ | $Z_4 + \tfrac{Z_2}{2}$ | $Z_3 + \tfrac{Z_1}{2}$ | $\tfrac{Z_5}{2} + Z_3 + \tfrac{Z_1}{2}$ | |
| 6 | $Z_6$ | $Z_5$ | $Z_4$ | $Z_6 + \tfrac{Z_4}{2}$ | $Z_5 + \tfrac{Z_3}{2}$ | $Z_4 + \tfrac{Z_2}{2}$ | $\tfrac{Z_6}{2} + Z_4 + \tfrac{Z_2}{2}$ | $\tfrac{1}{2}(\tfrac{Z_5}{2} + Z_3 + \tfrac{Z_1}{2})$ |
| 7 | $Z_7$ | $Z_6$ | $Z_5$ | $Z_7 + \tfrac{Z_5}{2}$ | $Z_6 + \tfrac{Z_4}{2}$ | $Z_5 + \tfrac{Z_3}{2}$ | $\tfrac{Z_7}{2} + Z_5 + \tfrac{Z_3}{2}$ | $\tfrac{1}{2}(\tfrac{Z_6}{2} + Z_4 + \tfrac{Z_2}{2})$ |
| 8 | $Z_8$ | $Z_7$ | $Z_6$ | $Z_8 + \tfrac{Z_6}{2}$ | $Z_7 + \tfrac{Z_5}{2}$ | $Z_6 + \tfrac{Z_4}{2}$ | $\tfrac{Z_8}{2} + Z_6 + \tfrac{Z_4}{2}$ | $\tfrac{1}{2}(\tfrac{Z_7}{2} + Z_5 + \tfrac{Z_3}{2})$ |

The filter circuit 2' illustrated in FIG. 6 comprises a combination of commercially available binary adders, registers and dividers of the kind described hereinabove as being employed in the filter circuit embodiment of FIG. 2. Each 8-bit digital word sample generated by the connecting lines A coupled to output of the register 49 appears at the first input of the adder 65 without delay and a sample sum appearing on connecting lines G coupling the output of the adder 65 to the input of the divider 66 is delayed one sampling signal time before it appears on the connecting lines H extending to the output 91 of the filter circuit 2'. The shortest signal transmission path generates the weighted average value $\frac{1}{4}Z_{n+2}$ specified in equation (8). The divider 66 provides a weighting coefficient of $\frac{1}{2}$. The remaining $\frac{1}{2}$ of the weighting of the average value is accomplished at the first input of the adder 65 by coupling each of the input bit lines A to a bit position input of the adder which is one bit position order lower than the bit position order of the input bit line.

Adder 65 and divider 66 are common to the three signal transmission paths. Therefore, the aforementioned differences in the transmission times through the three paths must be established before the adder 65.

The position of the signal transmission path of intermediate length between connecting lines A and a second input of the adder 65 includes another binary adder 62 followed by two cascaded binary registers 63 and 64. As described hereinbefore with reference to the embodiment of the filter circuit illustrated in FIG. 2, each of the registers transmits data from its input to its output in response to the sampling signal coupled to its clock input by line 88 and introduce a propagation delay of one sampling signal cycle in the signal transmission path. Consequently, the signal transmission path of intermediate length provides a signal transmission delay between lines A and the connecting lines F coupled to a second input of the adder 65 of two sampling signal cycles, which is two cycles longer than the delay through the corresponding shortest signal transmission path. Therefore, a sampling appearing on lines A coupled to the first input of adder 62 essentially will appear simultaneously on connecting lines D coupling the output of the adder to the input of the register 63. Upon the occurrence of the next sampling signal, the sample will be transmitted by the register 63 to the connecting lines E coupling the output of the register 63 to the input of the following register 64. Upon the occurrence of the second following sampling signal, the sample will be transmitted by the register 64 to the connecting lines F coupling the output of the register 64 to the second input of the adder 65. Thus, at the same time that register 49 provides a sample at the first input of the adder 65, a sample that was generated two sample periods earlier by the A/D converter 82 of FIG. 1 and transmitted through the transmission path of intermediate length is provided at the second input of the adder 65 by the register 64. The signal transmission path of intermediate length is coupleted through adder 65 and divider 66 to generate the weighted average value $\frac{1}{2}Z_n$ specified in equation (8).

The longest signal transmission path is formed in part by the signal transmission path of intermediate length, i.e., the path from adder 62 to divider 66 and in part by registers 60 and 61 preceding the adder 62. Each of the registers 60 and 61 introduces a propagation delay of one sampling signal cycle in the signal transmission path whereby the signal transmission delay between lines A and the connecting lines C coupled to a second input of the adder 62 is two sampling signal cycles. The value of each sample received at the second input of the adder 62 is weighted by a factor of $\frac{1}{2}$ by coupling each of the input lines C to a bit position input of the adder which is one bit position order lower than the bit position order of the input bit line. At the same time that the register 61 provides a sample at the second input of the adder 62, a sample that is generated two sample periods later by the A/D converter 82 of FIG. 1 is provided at the other first input of the adder 62 by the register 49. Therefore, the longest signal transmission path provides a signal transmission delay between lines A and the output 91 of the filter circuit 2' that is four sampling signal cycles longer than that provided by the shortest signal transmission path and generates the weighted average value $\frac{1}{4}Z_{n-2}$ specified in equation (8).

The operation of the filter circuit embodiment of FIG. 6 will be described now with reference to TAB. 2 that depicts the propagation and processing of consecutive samples through the filter circuit 2'. Consecutive samples $Z_1$, $Z_2$, $Z_3$, etc., are received in succession at the input of the register 49 from the A/D converter 82 via connecting lines 84 at a rate of four times the frequency of the selected component to be eliminated from the composite signal samples by the A/D converter. At each clock time, the register and divider devices included in the filter circuit 2' are clocked by the sampling signal applied to their respective clock inputs by line 88 to initiate processing of the digital signals present at their respective data inputs. For example, at the first clock time 1, register 49 is clocked to transfer sample $Z_1$ present on lines 84 to its output, which is coupled to lines A that extend to the inputs of register 60, adder 62 and adder 65. Immediately upon the occurrence of the sample $Z_1$ on lines A extending to the first input of the adder 62, the adder responds by transferring to its output the sum of the samples received at its two inputs. This sample sum, which includes sample $Z_1$, is coupled by lines D to the input of the register 63. In addition, the adder 65 responds by transferring to its output the sum of the samples received at its two inputs, which includes the sample $Z_1$ present on lines A as weighted by a factor of $\frac{1}{2}$ at the first input of the adder 65. This sample sum is coupled by lines G to the input of the divider 66.

Upon the occurrence of the next clock time 2, sample $Z_2$ is placed on lines A and D and the weighted sample $\frac{1}{2} Z_2$ is placed on lines G at the output of the adder 65 in the manner described hereinabove with respect to sample $Z_1$ at the clock time 1. In addition, registers 60, 61, 63 and 64 and divider 66 are clocked to process and transfer to their respective outputs the sample values present at their respective inputs. As a result, sample $Z_1$ is placed on lines B extending from the output of register 60 to the input of register 61, and on lines E extending from the output of register 63 to the input of register 64. Also, divider 66 weights the value of the sample sum then present on lines G by $\frac{1}{2}$ and places the weighted sample sum on lines H extending to the output lines 91. This weighted sample sum includes the weighted sample $\frac{1}{4} Z_1$.

During the next clock time 3, sample $Z_3$ is placed on lines A and D, sample $Z_2$ is placed on lines B and E and the weighted sample $\frac{1}{2} Z_3$ is placed on lines G in the manner described hereinabove with respect to samples $Z_1$ and $Z_2$ at clock times 1 and 2. In addition register 64 and divider 66 are clocked to process and transfer to their respective outputs the sample values then present at their respective inputs. This places sample $Z_1$ on lines F coupling the output of register 64 to the second input of the adder 65. Consequently, the adder 65 places a sample sum on lines G that includes sample $Z_1$ plus the weighted sample $\frac{1}{2} Z_3$. Register 61 places the sample $Z_1$ on lines C extending to the second input of the adder 62, at which point it is weighted by a factor of $\frac{1}{2}$ and placed on the lines D. Hence, before clock time 4, the combined sample value $\frac{1}{2} Z_1 + Z_3$ is transferred to the output of the adder 62 and is placed on lines D extending to the input of register 63. Divider 66 weights the sample sum present on lines G by a factor of $\frac{1}{2}$ and places the weighted sample sum on lines H extending to the output 91 of the filter circuit 2'. This weighted sample sum includes the weighted sample $\frac{1}{4} Z_2$.

During the next three clock times 4, 5 and 6, samples $Z_4$, $Z_5$ and $Z_6$ are successively placed on lines A by the timing buffer register 49 and are processed in the manner described hereinabove with respect to samples $Z_1$, $Z_2$, and $Z_3$ at previous clock times 1, 2, and 3. A more detailed understanding of the processing and propagation of samples $Z_4$, $Z_5$ and $Z_6$ through the filter circuit 2' in response to sampling signals at clock times 4, 5 and 6 can be had by reference to TAB. 2, above. Clocking the register and divider devices of the filter circuit 2' during the clock times 4 and 5 causes registers 63 and 64 to transfer the combined sample value $\frac{1}{2} Z_1 + Z_3$ from the input of the register 63 to lines F extending from the output of the register 64 to the second input of the adder 65 and causes the register 49 to place the sample value $Z_5$ on lines A extending to the first weighting input of the adder 65. Hence, at the end of the clock time 5, adder 65 provides a combined sample value $\frac{1}{2} Z_1 + Z_2 + \frac{1}{2} Z_5$ on its output coupled to lines G extending to the input of divider 66.

Upon the occurrence of the clock time 6, the combined sample value $\frac{1}{2} Z_1 + Z_3 + \frac{1}{2} Z_5$ present at the input of the divider 66 is weighted by a factor of $\frac{1}{2}$ and transferred to its output coupled to lines H extending to the filter circuit's output 91. The weighted output of the filter circuit, i.e., $\frac{1}{4} Z_1 + \frac{1}{2} Z_3 + \frac{1}{4} Z_5$ and following weighted sample value representations is in accordance with equation (8) and has the selected component whose frequency corresponds to one-fourth the frequency of the clocking signal eliminated because the weighted sample value representation of the selected component is zero, as can be seen upon consideration of equation (8) and FIG. 7.

It will be understood from the foregoing description that other combinations and arrangements of registers and arithmetic devices could be provided in a similar manner to obtain for a given number of averaged samples a zero weighted average sample value of a selected periodic signal.

To simplify the description, the frequency and phase of the sampling signal is selected so that the samples points $Z_1$ to $Z_7$ shown in FIG. 7 coincide with zero and maximum values of sine wave Z. It will become apparent with respect to the foregoing description that the embodiment of FIG. 6 also will provide a desired zero average value of sine wave Z if there is a constant phase difference between the sampling signal and the sine wave or selected signal component to be filtered.

The filter circuit embodiment of the present invention illustrated in FIG. 6 is particularly advantageous for filter circuits utilized in applications where the sampling signal frequency is an even number multiple of the frequency of the periodic signal component to be eliminated from a composite signal. The embodiment of FIG. 6 provides a desired zero weighted average value of the period signal component from a given odd number of samples. Consequently, the aforementioned potentially undesirable phase shift of one-half of the sampling signal period which would result from averaging an even number of samples is avoided by the circuit of FIG. 6.

With reference to the foregoing description, it is to be understood that the filter of the present invention is not limited to the above-described embodiments illustrated by FIGS. 2 and 6. It will become apparent to those skilled in the art that the filter may comprise various arrangements of digital signal processing means that cooperate to provide a zero average value or a weighted zero average value of the signal component to be eliminated from a composite signal in accordance with the described method of the invention. For example, the filter circuit may utilize circuit elements for dividing or partially dividing the samples followed by circuit elements for adding the divided samples instead of bit shifting the samples at the inputs of the adders as described above with reference to the embodiment of FIG. 6. Furthermore, the filter of the invention can be arranged to operate with various relationships of sampling signal frequency and frequency of signal component to be eliminated or filtered from a composite signal. As described hereinbefore, the sampling signal frequency can be an odd or even integral multiple of the selected periodic component frequency to be eliminated. Also, the sampling frequency can be a non-integral rational multiple of the selected periodic signal frequency. With respect to the embodiment illustrated by FIG. 6, an average of three weighted samples is obtained by weighting the first and last sample of five consecutive samples by one-half and not weighting the third of the five consecutive samples and dividing the sum of the three samples by a factor of two, i.e., weighting the sum by a factor of $\frac{1}{2}$. However, if the three samples are weighted by lower factor, such as one-eighth for the first and last sample of the five consecutive samples and one-fourth for the third sample, the weighted sum would have to be multiplied by a factor of two, i.e., weighted by a factor of 2, to obtain the desired average sample representation.

The filter of the present invention provides special advantages as a luminance-chrominance separator in color television signal processors, such as, for example, dropout compensators. FIG. 8 illustrates one embodiment of the dropout compensator of the present invention in which a digital color television signal is received at an input terminal 10 coupled to a first input 11 of a two-way switch 1. A control signal indicating presence of a dropout is received by a control terminal 12, for example, from a conventional dropout detector (not shown), such as included in commercially available video tape recorders. A suitable dropout detector may be of a conventional carrier monitor type which provides a control signal when the R. F. envelope of the modulated television signal drops below a predetermined level, such as used, for example, in the Ampex Corporation manufactured VPR-1 Video Production Recorder, and shown in the manual for that recorder, Catalog No. 1809276-02, published by Ampex Corporation in December, 1977, schematic drawing 1378633C, pages 8-41/42 and 8-43/44. The control terminal 12 is coupled to a control input 13 of switch 1. Output 14 of switch 1 is coupled to an output terminal 15 of the dropout compensator. The output 14 of switch 1 is also coupled to an input 18 of a digital filter 2 corresponding to the filter of the present invention, such as the above-described embodiments illustrated by FIG. 2 or FIG. 6, respectively. The output 14 of switch 1 is further coupled to first input 16 of a digital differencing circuit 3 via a digital delay circuit 7. A second input 17 of the differencing circuit 3 is coupled to an output 19 of the digital filter 2. An output 29 of the differencing circuit 3 is coupled to a first input 21 of a digital adding circuit 5 via a fixed digital delay line 4. The second input 22 of adding circuit 5 is coupled to the output 19 of the digital filter 2. An output 23 of the adding circuit 5 is coupled to a second input 24 of switch 1 via another fixed digital delay line 6. The delay circuit 7, coupled between the output 14 of switch 1 and input 16 of differencing circuit 3 is utilized to compensate for circuit delays in filter 2, as it will follow from the further description. The dropout compensator is controlled to process the digital television signal by a clock signal provided at input terminal 26. The provided clock signal is the signal related clock signal previously described as being generated for use by the filter circuit of the present invention and is determined by the particular filter embodiment used in the dropout compensator. If the filter circuit illustrated in FIG. 2 is used in the dropout compensator, the clock signal is obtained from the signal clock generator 83 of FIG. 1.

Now the operation of one preferred embodiment of the dropout compensator of the present invention will be described with reference to FIG. 8. A digital NTSC color television signal in the form of discrete 8-bit digital data words representing samples of the television signal, such as provided by the A/D converter 82 of FIG. 1, is received at input terminal 10 and fed to first input 11 of switch 1. When the television signal system is in normal operation, that is, no dropouts in the incoming signal are detected by the dropout detector, switch 1 is in its first position receiving the input signal at input 11 and applying it to input 14. When a dropout is detected in the color television signal, for example, by the aforementioned conventional dropout detector, the control signal received at terminal 12 is applied to control input 13 of the two-way switch 1. The control signal received by the two-way switch 1 causes it to disconnect the first input 11 from the output 14 and to connect its second input 24 to the output. Consequently, the signal representing a delayed portion of the digital color television signal received at second input 24 is now applied to output terminal 15. That delayed signal represents a dropout compensation signal utilized to replace the dropout portion of the television information signal, thus preventing any disturbances in the displayed television picture which would be caused by the presence of a dropout. The above-indicated dropout compensation may be provided for one or more television line periods or any fraction thereof.

The portion 25 of the dropout compensator circuit circumscribed by dashed lines, which provides the desired signal delay for dropout compensation, will be described now in accordance with the preferred embodiment of the invention shown in FIG. 8. Filter 2, which is designed, for example, as shown in FIG. 2, receives the digital composite color television signal from output 14 of switch 1 in the form of consecutive samples at a selected clock signal frequency, for example, equal to three times the nominal frequency of the NTSC chrominance subcarrier component, that is, $f_{sampl} = 3 \times 3.58$ MHz $= 10.74$ MHz. The sampling signal is phase locked to the chrominance subcarrier signal, as it is well known in the art, for example by phase-locking to the color burst component, as described in the previously mentioned AVR-2 Video Tape Recorder Catalog, pages 9-28 to 9-39. It follows from the foregoing description of the operation of the filter with respect to FIG. 1 that three samples define a time interval equal to one cycle of the chrominance subcarrier component. It also follows from the foregoing description that the lowest frequency component which is removed by filter 2 from the composite signal is 3.58 MHz. The next higher frequency component also removed by the filter is $2 \times 3.58$ MHz $= 7.16$ MHz. This latter frequency, however, is outside the frequency band of an NTSC signal whose total bandwidth is 4.2 MHz. Generally, in other conventional color television signal systems, such as PAL, PAL-M, etc., the total bandwidth is also below twice the color subcarrier signal frequency and, consequently, no signal degradation results.

As described hereinbefore with reference to FIG. 2, filter 2 provides an average of the amplitude values of three consecutive samples received at its input 18. It follows from equation (2) that each such average value of the chrominance subcarrier signal component is equal to zero. Consequently, the signal at the output 19 of filter 2 represents the composite color television signal from which the chrominance subcarrier component having a nominal frequency of 3.58 MHz is eliminated. Thus, the resulting signal at the output 19 of filter 2 is a chrominance-less color television signal, which will be considered further as representing the luminance component. It follows from the foregoing description, that the resulting signal at the output 19 of the filter 2 is represented by average samples values obtained by successively averaging three consecutive samples. Each obtained average sample value is substituted for the sample in the middle of each three consecutive samples taken for averaging. It is noted that the obtained averaged samples do not exhibit a phase-shift with respect to the originally received samples, since an odd number of consecutive samples is being averaged.

With further reference to FIG. 8, the signal from output 19 of digital filter 2 representing the separated luminance component is applied to the second input 17 of differencing circuit 3. The color television signal V from output 14 of switch 1 is applied via delay circuit 7 to the first input 16 of circuit 3. Differencing circuit 3 provides at its output 20 a difference signal of the two signals received at its first and second inputs. The resulting difference signal represents the separated chrominance component of the color television signal. It is seen from the foregoing description that by utilizing the digital filter 2 of the present invention in combination with the differencing circuit 3, as above disclosed, separation of the luminance and chrominance components of the color television signal is provided. The separated chrominance component at output 20 is delayed in the first delay line 4 by a time substantially corresponding to one horizontal line period of the television signal. The separated and delayed chrominance component and separated luminance component are respectively fed to inputs 21 and 22 of adding circuit 5. These two signal components are recombined in circuit 5 to form a composite color television signal at output 23 thereof. The latter signal is fed from output 23 of circuit 5 to input 24 of switch 1 through a second delay line 6, and it is delayed thereby by a time substantially corresponding to one horizontal line period of the television signal. The delayed signal represents the dropout compensation signal by which one or more consecutive lines, or fractions of lines, of missing television information may be replaced by the dropout compensator when a control signal at terminal 12 is applied, as it has been described previously. If it is necessary to replace more than one television line by the dropout compensator, the output signal from circuit 25, representing the dropout compensation signal, will circulate from output 14 of switch 1 to its second input 24 via circuit 25 and out through output terminal 15 until the control signal at 12 is removed.

It is to be realized that the above-described preferred embodiment of FIG. 8 represents a digital dropout compensator in accordance with the present invention in which high speed digital data is processed. Consequently, the various elements shown in the simplified block diagram of FIG. 8 may be designed as conventional digital circuits in which the high speed data is precisely clocked at three times the color subcarrier signal frequency, that is, at approximately 10.74 MHz, while the clock signal is frequency and phase-locked to the chrominance subcarrier component of the sampled color television signal, as described before. For simplicity of representation, the clock signal path is not shown in the block diagram, however, it is shown in a detailed circuit diagram of FIGS. 13a to 13h corresponding to the block diagram of FIG. 8, which circuit will be described later.

Delay circuit 7, shown in FIG. 8 as coupled between input 18 of digital filter 2 and input 16 of differencing circuit 3 in the composite color television signal path, serves to provide additional fixed delay to compensate for the propagation delay of the signal through the digital filter circuit 2. For proper operation of the digital dropout compensator, it is important to separate and combine corresponding data by the subtraction circuit 3 and addition circuit 5, respectively, in a precisely synchronized manner to prevent undesirable phase shifts between the separated chrominance and luminance component. Such phase shifts would introduce unacceptable time base errors and distort the resulting television picture. Therefore, it is necessary to determine the exact amount of fixed delay provided by the respective delay lines 4, 6 and 7 in such a way that the total delay of the chrominance signal component from output 14 of switch 1 to its input 24, that is, when passing through circuit branch 25, is exactly equal to two horizontal line periods of the color television signal received at terminal 12, whereas the total delay of the luminance signal component effected by its passage through the circuit branch 25 is exactly equal to one horizontal line period. For determining the exact amount of delay to be provided by each of the fixed delay lines 4, 6 and 7, respectively, the total amount of delay provided by the respective circuit elements in the luminance and chrominance signal paths should be considered. The actual amount of delay provided by delay lines 4, 6 and 7 should be adjusted accordingly. Consequently, in the preferred embodiment of FIG. 8, the delay provided by delay line 4 is equal to one horizontal line period less the delay provided by differencing circuit 3. Similarly, the actual amount of delay provided by delay line 6 is equal to one horizontal line period less the combined delays provided by filter 2 and adding circuit 5, respectively.

With respect to the well known relationship of the color subcarrier component frequency and horizontal line frequency of NTSC signals $f_{sc}=227.5f_H$, in this particular embodiment of the invention a non-integral number of samples equal to $3\times227.5=682.5$ clock cycles is obtained within one horizontal line period. To compensate for the non-integral relationship, delay line 6 may be designed to provide an alternative delay of, for example, 682 and 683 clock cycles on alternative consecutive lines, corresponding to the closest higher and lower integral number of clock cycles. Thus, the average delay provided by delay line 6 over any two consecutive lines will be 682.5 clock cycles. To compensate for the above deviation of one clock cycle on consecutive lines, delay line 4 may be designed to provide complementary delays in the chrominance signal path of, for example, 683 and 682 clock cycles, respectively, on alternative consecutive lines. Thus, a desired two line delay of exactly $2\times682.5$ cycles is provided by combined delay lines 4 and 6 in the chrominance signal path. However, it is noted with respect to the previous disclosure that, the actual delays provided by delay lines 6 and 4 will be reduced by the above mentioned respective circuit delays in the luminance and chrominance signal paths.

It will become evident that if an integral number of clock signals is provided within one horizontal line period, such as by selecting a sampling frequency equal to an even number multiple of the color subcarrier frequency, for example four times the color subcarrier frequency, the delay provided by delay line 4 does not have to be changed on alternate lines.

With respect to the above-described operation of the digital dropout compensator of FIG. 8, providing a one-line delay of the luminance component and a two-line delay of the chrominance component offers several advantages. First of all, the one-line delay of the wideband luminance component is an improvement over known digital dropout compensators, which provide a two-line delay of the luminance component. Secondly, the circuit of the present invention is an improvement over the prior art analog dropout compensators which provide one-line delay of both the luminance and chrominance component and require line-to-line inversion of the chrominance component to obtain a proper phase relationship thereof. As it has been pointed out above, these latter dropout compensators are not directly applicable for digital PAL or PAL-M systems. Similarly, they are not directly applicable for digital NTSC systems utilizing a sampling signal frequency equal to an odd integral multiple or rational number multiple of the NTSC subcarrier frequency. In case the above-indicated type of analog dropout compensator would be adapted for digital color television systems utilizing known comb filter circuits, it would be necessary to provide vertical alignment of samples. An advantage of the digital dropout compensator of the invention is that it does not require vertical alignment of samples thus eliminating the need for line-to-line adjustment of samples.

It is to be noted that in the digital dropout compensator of the present invention the separated chrominance component notched out by the filter has a bandwidth restricted to a single nominal frequency, such as 3.58 MHz for NTSC, or 4.43 MHz for PAL. This restricted bandwidth is very narrow in comparison to the luminance component bandwidth, which is, for example, D. C. to 4.2 MHz in NTSC systems. Consequently, the two line delayed chrominance component combined with the one line delayed luminance component does not represent objectionable distortion of the displayed television signal. When comparing the above-described dropout compensator of the invention to prior art analog compensators utilizing, for example, band pass filters for separation of the chrominance and luminance components, a dropout compensation signal comprising a luminance component delayed one line and a chrominance component delayed two lines would introduce a visible luminance to chrominance interference in the television picture. This is largely due to a relatively wide nominal bandwidth of the separated analog chrominance component resulting from the well known frequency characteristics of analog filters. Furthermore, when recombining the separately processed components into a composite signal by the dropout compensator of the present invention, the full original frequency bandwidth of the television signal is restored, thus practically no frequency losses occur. As opposed thereto, losses in the composite signal bandwidth are effected when analog filters are utilized for signal processing.

There is a further advantage of the dropout compensator of the present invention when comparing to known analog compensators. In the dropout, compensator of the present invention, no relative delay between the luminance and chrominance component other than the desired one horizontal line delay occurs in the composite signal processed by the compensator, since these signal components are maintained synchronous throughout the processing by precisely clocking the digital signals, and the respective delays provided by various circuit elements are known and compensated for by fixed delay lines.

Since the filtering process of the present invention is restricted to averaging a few consecutive samples within the same television line, any unwanted short time disturbances, such as noise spikes introduced into the television signal, are limited in time to the occurrence of the particular samples and to the relatively short time in which they are averaged. As opposed thereto, known digital comb filters providing sample values taken from samples of different television lines or, analog filters whose time response effects visible transients in form of streaks in the displayed television signal caused by noise spikes, provide a more extensive signal distortion.

Still, there is a further advantage of the digital dropout compensation circuit of the present invention in that all signal processing is provided in real time utilizing standard TTL (transistor-to-transistor logic) circuitry, as it will be seen from a detailed circuit diagram of a preferred embodiment of the present invention shown in FIGS. 13a to 13h, the description of which follows. The circuit of the above-indicated figures is suitable for dropout compensation in a color television signal recording and reproducing system where an NTSC, PAL, PAL-M, etc., color television signal is encoded in digital form by sampling at a frequency equal to three times the color subcarrier frequency of the television signal. First, an embodiment suitable for use in NTSC systems will be described, in which the sampling signal frequency $f_{sampl} = 3 \times 3.58$ MHz $= 10.74$ MHz. The sampling signal is phase locked to the color burst component of the subcarrier signal as well known in the art. The sampling frequency is equal to the clock frequency as previously mentioned with respect to the description of FIG. 8; consequently, in the further description we will refer interchangeably to the sampling frequency and clock frequency.

Generally, for operation of the dropout compensator of the invention, the sampling frequency utilized to encode the composite analog signal, for example, the color television signal, does not have to be the same as the clock signal frequency utilized to synchronize the various elements of the dropout compensation circuit. In the latter case the samples may be received and stored in a buffer circuit, for example, at the sampling frequency, and subsequently recovered at a different clock frequency, while the latter frequency is utilized for synchronization of the circuit.

Alternative dropout compensator embodiments are shown in FIGS. 9 to 11 and will be described briefly. To facilitate comparison with the previously described embodiment of FIG. 8, similar circuit elements in the following alternative embodiments are designated by like reference numerals. The circuit of FIG. 9 is similar to that of FIG. 8 with the exception that the input of the circuit branch 25, that is, input 18 of filter 2 and input 27 of delay circuit 7, respectively, are coupled to input 11 of switch 1, instead of to its output 14, as it is in FIG. 8. This particular circuit arrangement is useful when only one line of the television information is to be replaced by a dropout compensation signal since no means is provided for recirculating the delayed information from the output of the switch back to its input as in the circuit of FIG. 8. If it is necessary to compensate for more than one television line, additional memory means, such as a known circulating memory, could be utilized at the output of switch 1.

FIGS. 10 and 11 depict further alternative embodiments of the dropout compensator of the present invention. These latter embodiments differ from the previously described embodiments of FIGS. 8 and 9 by the implementation of the circuit branch 25, as follows. In the embodiment of FIG. 10, the delay line 6 of the embodiment of FIG. 8 is replaced by delay line 30 coupled in the composite television signal path between the output 14 of switch 1 and input 18 of filter 2. Delay line 30 provides delay for both the chrominance and luminance component of a period of one horizontal line less the combined delays in filter 2 and adder 5. It is seen that the resulting respective delays of the chrominance and luminance component are the same as in the previously described circuit of FIG. 8.

In the circuit branch 25 of the embodiment of FIG. 11, the delay line 6 in the corresponding circuit branch 25 of the embodiment of FIG. 8 is replaced by a delay line 31 coupled in the separated luminance signal path between the output 19 of filter 2 and input 22 of summing circuit 5, by an additional delay line in the separated chrominance signal path, as it is explained below. Filter 31 provides a one horizontal line delay less the combined delays provided by filter 2 and adder 5. Delay line 4 of FIG. 8 is replaced in the embodiment of FIG. 11 by a delay line 32 coupled in the separated chrominance signal path between the output 20 of the differencing circuit 3 and input 21 of adder 5. Delay line 32 provides a two horizontal line delay less the combined delays in circuits 7, 3, and 5. Consequently, the desired one line delay of the luminance component and two line delay of the chrominance component are provided each in the respective separated signal paths of these components in the circuit of FIG. 11.

It will become apparent from the above description that the dropout compensator of the present invention may be implemented by a variety of combinations of delay means coupled in the composite signal path as well as in the separated chrominance and luminance signal paths to achieve the desired one-line luminance and two-line chrominance component delay, respectively. It will become further apparent that various alternative embodiments of circuit branch 25 of the dropout compensator may receive an input signal directly, as shown in FIG. 9 or via switch, as shown in FIGS. 8, 10 and 11. It will also become apparent that in the embodiments of FIGS. 8 to 11 filter 2 may be implemented to provide an average value output signal or a weighted average value signal in accordance with the foregoing disclosure with respect to FIGS. 2 and 5.

An example of a preferred embodiment of the dropout compensator of the present invention arranged to process a digital NTSC color television signal formed by sampling the signal at a sampling frequency that is an even number multiple of the color subcarrier signal frequency is illustrated in FIG. 12. In that embodiment, a sampling frequency of four times the color subcarrier frequency is used. As is well known in the art, sampling an NTSC color television signal at a frequency equal to an even number multiple of the color subcarrier signal frequency results in obtaining samples corresponding to locations of vertically aligned picture elements. However, an NTSC color subcarrier signal has an opposite phase on consecutive horizontal lines and an identical phase on every other line. Consequently, to achieve a properly phased dropout compensation signal, a separated NTSC chrominance component may be simply inverted on consecutive lines, as it is known in the art. To facilitate a comparison with the previously described embodiments of FIGS. 8 to 11, corresponding circuit elements in the embodiment of FIG. 12 are designated by corresponding reference numerals. To avoid undue repetition, only those portions of FIG. 12 will be described which are different from the previously described circuits of FIGS. 8 to 11. As mentioned above, the embodiment of FIG. 12 uses a sampling frequency $f_{sampl}$ that is an even multiple of the subcarrier frequency $f_{subc}$, a clock signal frequency equal to $4 \times 3.58$ MHz = 14.32 MHz. In the embodiment of FIG. 12, filter 2 may be designed in accordance with the embodiment of FIGS. 2 or 5, as previously described.

In the embodiment of FIG. 12, an NTSC color television signal is separated into its luminance and chrominance component at the output of filter 2 such as previously described with respect to FIG. 8. When comparing the circuit of FIG. 12 to the circuit of FIG. 8, it is seen that delay line 4 in the separated chrominance component path is replaced by phase inverter 40. To compensate for the circuit delay of the inverter, an additional delay circuit 41 is coupled in the separated luminance signal path. Delay circuit 41 provides a delay equal to that provided by inverter 40. Thus, the same amount of delay in both the separated luminance and chrominance signal paths is provided in preparation for subsequent combination of the separated signals in adding circuit 5. Consequently, the one-line delay 6 provides a delay equal to one horizontal line interval less the combined circuit delays of filter 2, delay circuit 41, and adding circuit 5. It follows from the foregoing description that both the luminance and chrominance components of the dropout compensator in FIG. 12 are delayed by one horizontal line interval.

One preferred embodiment of specific circuitry for implementing the dropout compensator embodiment of the present invention shown in FIG. 8 is illustrated in consecutive FIGS. 13a to 13h. To facilitate comparison between FIGS. 8 and 13, individual circuits in the specific circuitry of FIGS. 13 corresponding to elements of the block diagram of FIG. 8 are circumscribed by dashed lines and designated by like reference numerals. Similarly, connecting lines between the individual circuits of the specific circuitry are designated by reference numerals corresponding to input/output designations of corresponding blocks of FIG. 8. For the purpose of complete disclosure, the integrated circuit components shown in FIGS. 13a to 13h are designated by respective part numbers commonly used by manufacturers.

In FIG. 13a, consecutive 8-bit parallel digital word samples $S_1$, $S_2$, $S_3$, etc., of the digital color television signal are received at input 10 of the dropout compensator by two data selector/multiplexers U42 and U51 of switch 1. These multiplexers also receive data at input 24 from delay line 6, shown in FIGS. 13g and 13h. A control signal is received at input 12 by the multiplexers from a conventional R. F. envelope level dropout detector circuit (not shown), as mentioned before. In normal operation, the multiplexers apply the input data from 10 to output 14. When the control signal at 12 is received, the multiplexers switch from input 10 to input 24. The data from 14 is fed to output 15 of the dropout compensator, and it is also supplied to the inputs 18 of the three transmission paths through the filter circuit 2 located in FIGS. 13a, 13b and 13c. A filter circuit embodiment of the kind shown in FIG. 2 is utilized. The data from 14 is applied to the first register 50 of the filter circuit formed of flip-flops U66 and U9, which delays the first sample $S_1$ by one clock signal period to assure its proper timing for addition with the second sample $S_2$ received one clock signal later. Samples $S_1$ and $S_2$ are coupled for adding in adder 51 formed of two 4-bit binary adders U75 and U83 shown in FIG. 13b and the sum $S_1 + S_2$ is coupled to register 52 formed by flip-flops U57 and U50, which provides the one clock signal delay in preparation for addition with the subsequently received sample $S_3$. The latter summation is performed by the adder 53 formed by two 4-bit binary adders U58, U67, and an output signal therefrom represents the sum $S = S_1 + S_2 + S_3$. The summed signal S is coupled to register 54 formed by flip-flops U49, U50 to assure proper timing for further processing. In this particular embodiment of the invention an average sample value is obtained by dividing signal S by 3. The division by 3 is performed with a 0.13% accuracy by an approximation algorithim:

$$\frac{S}{3} = \frac{S}{4} + \frac{S}{16} + \frac{S}{64} + \frac{S}{256} \tag{10}$$

For the particular application of averaging the samples in the presently described preferred embodiment, the approximation algorithm of equation (10) is implemented in two steps as follows:

$$PS = \frac{S}{4} + \frac{S}{16} \tag{11}$$

$$\frac{S}{3} = PS + \frac{PS}{16} \tag{12}$$

Steps (11) and (12) are performed by the divider 57 of filter 2 shown in FIG. 13c as described below.

4-bit binary adders U39, U48 of FIG. 13c receive the signal S at two sets of inputs. At one of the inputs, the lines are coupled to the adder in a conventional manner to bit shift the signal S two bit positions to become S/4. The adder provides a sum of (S+S/4). At the output of the adder, the summed signal is shifted conventionally another bit position to obtain an output signal corresponding to $(S + \frac{S}{4})/2.$ The latter output signal represents twice the partial sum PS defined in equation (11). The signal 2PS is applied to flip-flops U40, U14, which are clocked to supply signal 2PS to two sets of inputs of the 4-bit binary adders U32 and U33. At one of the inputs, the lines are coupled conventionally to the adders to bit shift the signal 2PS four bit positions to obtain 2PS/16. At the output of the adders, the summed signal is conventionally shifted another bit position to provide an output signal corresponding to $(2PS + \frac{2PS}{16})/2.$ This output signal represents S/3 of the approximation algorithm indicated by equation (12). The obtained signal S/3 corresponds to the previously described average value output signal of the filter of FIG. 2 at the output VII of divider 57. For better comparison with FIG. 2, corresponding registers and adders in FIGS. 13a and 13b and the divider in FIG. 13c of the filter circuit 2 are respectively designated by like reference numerals. The output signal of the divider 57 in FIG. 13c thus represents the chrominanceless color television signal, that is, the separated luminance component, as has been described above with reference to FIG. 8. Signal S/3 is applied to flip-flops U31 and U22 which provide both an output signal S/3 applied to input 22 of adder 5 shown in FIG. 13f and an inverted output signal —S/3 applied to input 17 of differencing circuit 3 shown in FIG. 13d.

The differencing circuit 3 includes 4-bit binary adders U30, U21 that receive the signal —S/3 at one set of inputs 17. As it is shown in FIG. 13a, the color television data received by switch 1 is applied to the delay line 7 comprising flip-flops designated U8, U65, U56 and U47, which are clocked by the clock signal on line 26 to provide a fixed predetermined delay of the received signal to compensate for a known amount of delay provided by the filter circuit 2 illustrated in FIGS. 13a through 13c. The output data, indicated V, of delay line 7 is applied to a second set of inputs 16 of adders U30, U21, of the differencing circuit 3 shown in FIG. 13d. The above adders provide an output signal (V—S/3) which represents the separated chrominance component of the color television signal, as described above with reference to the embodiment of FIG. 8. The obtained chrominance component is fed via clocked flip-flops U29, U3 and output 20 of circuit 3 to the delay line 4 shown in FIG. 13e.

Delay line 4 comprises eight identical 4×256 bit random access memories of which six memories designated U26, U17, U1, U27, U18 and U2 are shown. Two groups of four memories each are utilized for receiving higher and lower order bits, respectively. The delay line 4 provides a fixed amount of delay of the separated chrominance component, equal to one horizontal line period of the color television signal less the delay in differencing circuit 3 coupled in the chrominance signal path. The writing of data into and reading of data from the memories of the delay line 4 is controlled by control signals $\overline{OE_1}$ through $\overline{OE_4}$. These signals are obtained from the memory address generator 9 shown in FIG. 13d, which will be described in further detail hereinbelow. Cascaded clocked flip-flops U11, U3 and U12, U3 and multiplexers U20, U4 are utilized to assure proper timing of output data at output 28 from delay line 4 to achieve the foregoing delay.

To effect the aforedescribed alteration of the delay provided by the delay line 4 so that the overall delay in the chrominance signal path is changed between 682 and 683 clock cycles, a control signal, $\overline{WAO}$, is applied to the multiplexers U20, U4 to switch the output of the multiplexers between its two inputs respectively supplied by the flip-flops U11, U3 and U12, U3. The control signals, $\overline{WAO}$, is a signal that alternates between a high and low logic level at a frequency equal to one-half the horizontal line rate and is generated to be synchronous with the 10.7 MHz clock signal and the horizontal synchronizing signal of the video signal being processed by the dropout compensator. During each cycle of the control signal, $\overline{WAO}$, it is at one of its logic levels for an interval equal to 682 clock cycles and at the other for an interval of 683 clock cycles. Switching the output of the multiplexers between the inputs supplied by the two clocked cascaded flip-flops has the effect of inserting (or removing) one clock cycle of delay into the delay 4. With the output of the multiplexers coupled to the input supplied by the flip-flop U12, U3, the delay provided by delay device 4 is one clock cycle longer than when the multiplexer's output is coupled to receive data supplied by the flip-flop U11, U3. This additional one clock cycle of delay is the time required to transfer data from the output of flip-flop U11, U3 to the output of flip-flop U12, U3.

The delayed chrominance component provided at the output 28 of delay 4 is applied to input 21 of adder 5 shown in FIG. 13f. As shown in FIG. 13f, the data from input 21 is applied to a first set of inputs of 4-bit binary adders U37, U13. The data S/3 from input 22, representing the separated luminance component, is applied to a second set of the inputs of the adders via clocked flip-flips U38, U14 to assure proper timing for addition. The output data from the latter adders represents a composite color television signal in which the chrominance component is delayed about one horizontal line period of the television signal while the luminance component is essentially undelayed, with the exception of the respective circuit delays as indicated before.

To prevent foldback in the output signal from adders U37, U13, an overflow and underflow indicating circuit is utilized in the circuit of FIG. 13f as follows. The most significant bit $C_1$ at the input of adder U37 is applied via inverter $I_1$ to the input of AND gate $A_1$. The other input of $A_1$ is formed by the "carry" output at pin 9 of adder U37. The output of $A_1$ is applied to one input of OR gates $0_1$ to $0_8$, respectively. The other inputs of the OR gates receive the output signal from adders U37, U13. The output signal from the OR gates $0_1$ to $0_8$ is applied to multiplexers U39, U46. Whenever an overflow occurs, the AND gate $A_1$ activates the OR gates to force the mutliplexers U39, U46 to place a high logic level signal on all its output lnes 23 when clocked by the clock signal. For underflows, the "carry" output of pin 9 of adder U37 is also applied via inverter $I_2$ to one input of NAND gate $N_1$, which also receives at its other input the most significant bit $C_1$ applied at the input of adder U37. The output of $N_1$ is applied to a control input of the multiplexers U39, U46. Whenever an underflow condition occurs, which is represented by a simultaneity of conditions at pins 9 and 11 of the adder U37, the output of the NAND gate $N_1$ goes to a low logic level and forces the multiplexer U39, U46 to place a low logic level signal on all of its output lines 23.

As it is known in the art, the NTSC chrominance subcarrier component has an opposite phase at the beginning of each consecutive television line, and consequently, it has the same phase at the beginning of every other line. It is also known in the art that for obtaining a dropout compensation signal it is necessary to delay both the luminance and chrominance component by one horizontal line period. However, to achieve a proper line-to-line phase relationship of the chrominance component in the embodiment of FIGS. 13a to 13h, the latter component is delayed by two horizontal line periods as will become apparent from the following description.

The signal at the output 23 of multiplexers U39, U46 in FIG. 13f represents an NTSC color television signal having the chrominance component delayed substantially by one horizontal line period and having the luminance component substantially undelayed. The combined composite television signal from the output 23 is applied to the second delay line 6 shown in FIGS. 13g and 13h. Delay line 6 comprises eight identical 4×256 bit random access memories of which six memories designated U79, U70, U52, U80, U71 and U53 are shown. Two groups of four memories each are utilized to receive higher and lower order bits, respectively. The delay line 6 delays the composite color television signal for an interval that is adjusted on alternate horizontal lines by one clock signal cycle so that a delay of 682 or 683 clock signal cycles less the respective circuit delays in the luminance signal path provided by the filter 2 and adder 5 is provided.

Alteration of the length of the delay provided by delay line 6 is effected by the multiplexer U82, U73 and clocked flip-flops U81, U74 shown in FIG. 13h. These multiplexers and flip-flops cooperate in the same manner as the corresponding devices described hereinbefore with reference to the delay line 4 illustrated in FIG. 13f to alternately insert and remove the flip-flops from the signal path of the delay line 6. As in the case of the delay line 4, the output of the multiplexers U82, U73 is alternately switched between its inputs by the previously described control signal $\overline{WAO}$. Delay lines 4 and 6 are synchronously clocked so that each provides the same length of delay at the same time. Consequently, the separated chrominance component will pass through the delay line 4 while the delay lines 4 and 6 each provide a first delay that corresponds to an overall delay of, for example, 682 clock signal cycles. However, the same chrominance component (now combined with the luminance component) passes through the following delay line 6 after the multiplexers of the delay lines have been switched so that a delay corresponding to an overall delay of 683 clock signal cycles is provided. Thus, the chrominance component experiences a two line overall delay and an average delay of 682.5 clock signal cycles relative to the luminance component. The luminance component experiences essentially a one line overall delay. The alteration of the delay provided by delay line 6 by one clock cycle of the 10.7 MHz clock signal does not introduce significant luminance disturbances in the displayed picture containing a substituted, dropout compensating portion.

As it is seen from the above description, the combined delays provided respectively by filter 2, adder 5 and delay line 6 effect a luminance signal delay corresponding to about one horizontal line period. Similarly, the combined delays provided respectively by delay line 7, differencing circuit 3, delay lines 4 and 6 and adder 5 effect a chrominance signal delay corresponding to two horizontal line periods. As shown in FIG. 13h, the output data from delay line 6 is applied to input 24 of switch 1 shown in FIG. 13a. As it has been described previously in the specification with respect to FIG. 8, the latter data represents a color television dropout compensation signal in which the luminance component is delayed by a period of one horizontal line and the chrominance component by two horizontal line periods.

FIGS. 13f and 13d show respective circuit diagrams of memory address generators 8 and 9 providing address signals on memory address lines $A_0$ to $A_7$ and $A'_0$ to $A'_7$, respectively, and write and read enable control signals on memory write/read lines $\overline{OE_1}$ to $\overline{OE_4}$ and $\overline{WE_1}$ to $\overline{WE_4}$, which are coupled to control the data flow through the respective delay lines 6 and 4. In FIG. 13d, counters U19, U28 and U36 are coupled to count clock cycles corresponding to the actual delay provided by the delay line 4 coupled in the chrominance signal path, as previously described with respect to FIGS. 8 and 13a to 13h. The binary output of counter U36 is coupled to a two bit binary decoder U44, which decodes the two bit binary input signal into a corresponding four line output signal. The four bit signal is applied to a D-type flip-flop U35 which, in turn, provides a four bit control signal on lines $\overline{OE_1}$ to $\overline{OE_4}$. Each bit of the latter signal is utilized as a memory write and memory read signal to control the respective read and write cycles of the previously mentioned random access memories U26, U17, U1, U27, U18 and U2 of the delay line 4 in FIG. 13e. The memory write control signals are coupled to pin 20 and memory read signals to pin 18 of each memory.

In FIG. 13f the counters U72, U63 and U54 are coupled to count clock cycles corresponding to the actual delay provided by delay line 6 coupled in the combined dropout compensation signal path, as previously described with reference to the above-indicated figures. The circuit design of the memory address generator 8 of FIG. 13f is similar to that of memory address generator 9 of FIG. 13d. Consequently, the four bit memory write and read control signal on lines $\overline{WE_1}$ to $\overline{WE_4}$ at the output of D-type flip-flop U43 in FIG. 13f is analogous to the above-described control signal $\overline{OE_1}$ to $\overline{OE_2}$ of FIG. 13d and it is utilized to control the write and read cycles of random access memories U79, U70, U52, U80, U71 utilized in delay line 6 of FIG. 13g. The diagrams of FIGS. 13f and 13d reveal the memory address generators 8 and 9 in sufficient detail; consequently, no further disclosure thereof is necessary.

As it will become apparent to those skilled in the art, alternative embodiments similar to the disclosed detailed circuit diagrams of FIGS. 13a to 13h, as well as alternative circuit elements in these embodiments, may be utilized to obtain the disclosed operation of the dropout compensator in accordance with the method of the present invention. Thus, the differencing circuit 3 may be implemented as a subtracting circuit to which respective signals of the same polarity are applied, as it is known in the art. Similarly, known alternative circuit elements in the summing circuit 5 may be utilized to obtain the combination of the chrominance and luminance components. As an alternative, different means of obtaining the delay in the delay lines 4 and 6 may be utilized, such as shift registers, instead of the random access memories. Likewise, to obtain division by 3 of the samples in filter circuit 2, read only memories may be utilized instead of the disclosed circuit elements implementing the approximation algorithm of equation (10).

Hereinbefore, examples of preferred embodiments of dropout compensators have been described for compensating NTSC color television signals. As it will become apparent to those skilled in the art, the various embodiments could be adapted for dropout compensation of other color television systems, such as PAL, PAL-M, etc. For example, the detailed circuit diagram as shown in FIGS. 13a to 13h may be utilized for PAL systems with the exception of the respective memory address generator circuits 9 and 8 for controlling the respective delay lines 4 nad 6. The latter difference in the circuit diagrams is necessitated because of the difference in the relationship of the chrominance subcarrier signal frequency to the horizontal line frequency in NTSC and PAL systems. For PAL color television signals, a three times chrominance subcarrier clock signal frequency of 13.29 MHz is required in contrast to 10.7 MHz for NTSC signals. Since the horizontal line frequency of PAL and NTSC signals differ by less than 1 percent, the higher sampling frequency in PAL results in a hiher number of clock cycles per one horizontal line period. Consequently, for PAL signals, the above-mentioned circuits 4, 6, 8 and 9 of FIGS. 13a to 13h have to be adapted to process the higher number of clock cycles per line to provide substantially the same amount of fixed delay as provided for NTSC signals. Furthermore, the clock signals indicated 10.7 MHz and $\overline{10.7\text{ MHz}}$ in FIGS. 13a to 13h will be replaced by 13.3 MHz and $\overline{13.3\text{ MHz}}$, respectively. Similar changes would have to be made in circuit elements of the respective embodiments of FIGS. 9 to 12 if they are to be arranged to process PAL or other television signals. In addition, a sampling frequency that is an even multiple of the PAL (or other television signal) color subcarrier frequency may be employed. FIGS. 14 and 15 illustrate block diagrams of a PAL dropout compensator in which the PAL television signal is sampled at a frequency equal to four times the PAL color subcarrier frequency, i.e., 17.72 MHz, and a filter circuit 2 is used that is adapted to process such samples, such as a filter circuit of the type shown in FIG. 6. Since the embodiments of FIGS. 14 and 15 are similar to those illustrated in FIGS. 8 to 12, corresponding circuit elements in the various embodiments are identified by corresponding reference numerals and only those portions of FIGS. 14 and 15 will be described which are different from the previously described embodiments.

The embodiment of FIG. 14 is useful for compensating both PAL and PAL-M color television signals. The separated chrominance component is delayed on consecutive lines by a one-line delay circuit 4 and inverted by phase inverter 40, both latter elements being coupled in the separated chrominance signal path. The delay provided by delay line 4 is equal to one horizontal line period less the combined circuit delays in differencing circuit 3 and phase inverter 40. The one-line delay means 6 provides a delay equal to one horizontal line period less the combined circuit delays provided by filter 2 and adding circuit 5. Thus, in the embodiment of FIG. 14, the luminance component is delayed by essentially one horizontal line period and the chrominance component by two horizontal line periods.

In the embodiment of FIG. 15, a dropout compensator circuit in accordance with the present invention is shown, suitable for PAL and PAL-M system applications. The separated chrominance component at the output of the differencing circuit 3 is color decoded by decoder 42 into its u and v color components as it is known in the art. For example, if the sampling of the color television signal is done precisely along the color subcarrier component axis, alternative consecutive samples will represent the respective u and v components. The latter follows from the well known feature of PAL and PAL-M signals, that the u and v components are quadrature-modulated onto the subcarrier thus having a phase difference of exactly 90° at all times. Consequently, when the sampling frequency is equal to four times the color subcarrier signal frequency and the sampling signal is in phase with the color subcarrier signal, the decoder 42 may be implemented by a simple gate for separating alternative consecutive samples pertaining to the u and v components, respectively. The above-indicated decoding technique is well known in the PAL or PAL-M systems. The separated v components is then inverted by a phase inverter 44. The separated u components and inverted v component are combined in adder 45, for example, by simply adding the two components u and (−v). To compensate for the circuit delay of inverter 44, a delay circuit 43 is utilized in the separated u signal path, coupled between the output of decoder 42 and adder 45, to obtain the same amount of delay of the u and v components in preparation for the subsequent addition in adder 45. Similarly, delay circuit 41 coupled in the separated luminance signal path between the output of filter 2 and input of adder 5 has a delay equal to the combined circuit delays of elements 3, 42, 43 and 45, in the separated chrominance signal path to provide exactly the same amount of delay in the separated chrominance and luminance signal paths, respectively, in preparation for subsequent addition of these components in adder 5.

It follows from the foregoing description that both the chrominance and luminance signal components are delayed in the circuit of FIG. 15 by one horizontal line period.

The line-by-line one-quarter cycle offset resulting from the 90 degree phase shift occuring in the PAL subcarrier component during consecutive television lines is selectively adjusted in the PAL-type dropout compensators of the present invention when a previous line of the television signal is substituted for a subsequent defective line of the television signal. This is achieved by applying an appropriate number of clock signals to the respective delay lines 4 and 6 of the various embodiments, and shifting the beginning of each consecutive line accordingly to compensate for the offset.

To illustrate this, FIGS. 16a and 16b reveal detailed circuit diagrams of respective memory address generators for utilization in the dropout compensator circuit of FIGS. 13a to 13h as adapted for PAL color television signals. More particularly, the PAL memory address generator circuit 109 shown in FIG. 16a replaces the NTSC memory address generator 9 of FIG. 13d, and the PAL circuit 108 shown in FIG. 16b replaces the NTSC address generator 8 of FIG. 13f.

In FIG. 16a, a first signal $C_1$ of frequency $f_{H/4}$, that is, one-quarter of the 15.625 kHz PAL horizontal sync frequency, is received by a flip-flop U221. A second signal $C_2$ of frequency $F_{H/2}$, that is, one-half of the PAL horizontal sync frequency, is received by flip-flop U223. Both signals $C_1$ and $C_2$ are frequency and phase locked to the standard PAL four horizontal line sequence television signal received at terminal 10 in FIG. 13a and they may be obtained from a conventional PAL sync processing circuit (not shown). These signals are clocked by the flip-flops U221 and U223 for noise immunity. The $f_{H/4}$ output signal from flip-flop U221 is fed via inverter U222 to both flip-flops U224 and U225. The latter flip-flops each receive an $f_{H/4}$ signal from flip-flop U223, which in turn, is clocked by a 13.3 MHz clock signal. The frequency of the clock signal corresponds to three times the PAL color subcarrier signal frequency 4.43 MHz. Flip-flops U224 and U225 both divide the frequency of the signals at their respective input signals by two. Thus, the respective output signals of flip-flops U224 and U225 have a frequency $f_{H/4}$ and are phase locked to each other by the above-described operation of circuit elements.

An H-rate write pulse, $f_H$, is received by a one-shot multivibrator U226 which operates as a pulse stretcher. The write pulse is modulated by the well-known PAL H/4 horizontal line sequence and is generated by the aforementioned conventional PAL sync processor circuit to be frequency and phase locked to signals $C_1$ and $C_2$. The stretched write pulse is received by a counter U227, which also receives the $f_{H/4}$ signal from flip-flop U224 and the 13.3 MHz clock signal. The stretched write pulse indicated "counter reset" is utilized to reset the counter U227 at the beginning of each horizontal line.

Memory address counters U229, U230, U231 and U235 are coupled to count 0 to 768 clock cycles at the 13.3 MHz clock signal rate in a wall known manner to effect the generation of memory address signals $A'_0$ to $A'_7$ and write and read enable signals $\overline{OE_1}$ to $\overline{OE_4}$ for use in the control of random access memories of the delay line 4 shown in FIG. 13e. A two-by-four decoder U236 and following clocked latches U237, U238 respond to the counters to provide the address signals and write and read enable signals in the manner described hereinbefore for the comparable devices included in the memory address generator 9 illustrated in FIG. 13d. The aforementioned one-quarter subcarrier cycle line-by-line adjustment is effected by counter U227. The output signal of counter U227 is coupled via inverter U228 to counters U229, U230 and U231 and via an additional flip-flop U233 to counter U235. The output signal of counter U227 is utilized to start the memory address counters at the beginning of ech horizontal line. Modulation of the output signal of counter U227 by the $f_{H/4}$ signal from flip-flop U224, effects shifting of the beginning of each consecutive horizontal line to obtain the desired offset by one-quarter of the subcarrier cycle on consecutive horizontal lines. The above-mentioned 768 clock cycles correspond to the one-line delay provided by the delay line 4 in the chrominance signal path as it has been described in detail with respect to the block diagram of FIG. 8 and detailed diagram of FIGS. 13a to 13h.

As it is revealed by the drawings, the memory address generator circuit 108 of FIG. 16b is similar to the above-described circuit 109 of FIG. 16a. Both pulses, the $f_{H/4}$ output pulse from flip-flop U225 and the counter reset pulse from U226, are applied to counter U227a of circuit 108. As it will become apparent from comparing the circuits of FIGS. 16a and 16b, the operation of counter U227a of FIG. 16b is similar to the previously described operation of counter U227 of FIG. 16a. Consequently, circuit 108 operates in a similar manner as the previously described circuit 109. However, the actual count provided by the memory address counters of FIG. 16b transferred via memory address lines $A_0$ to $A_7$ to random access memories of delay line 6 shown in FIG. 13g, is different from the count provided by circuit 109. The latter difference is effected with respect to the different length of the one-line delay 6 in the recombined luminance and chrominance signal path, as it has been previously disclosed with respect to FIGS. 8 and 13a to 13h. Thus, the minor differences between the respective circuit diagrams of FIGS. 16a and 16b reflect the above-indicated variations.

A PAL or PAL-M chrominance subcarrier signal has an incremental 90 degree phase shift on consecutive lines and has an opposite phase on every other line. Consequently, a PAL or PAL-M signal has an identical phase on every fourth line. To achieve a proper phase of the dropout compensation signal for PAL or PAL-M signals, the separated chrominance component may be delayed by one horizontal line period and inverted on consecutive lines or, instead, the separated chrominance component may be decoded into u and v components and the v component subsequently inverted on consecutive lines to achieve vertical alignment of samples of the dropout compensation signal.

With respect to variations of the various embodiments of the present invention, it should be apparent that instead of coupling the input of the dropout compensator circuit 25 to output 14 of switch 1, as shown in FIGS. 12, 14 and 15 it may be coupled to input 11, of switch 1, similarly as shown in FIG. 9. Furthermore, in the embodiments of the invention shown in FIGS. 12, 14 and 15 a sampling frequency equal to four times the color subcarrier frequency is used. Therefore, it is advantageous to utilize the embodiment of filter 2 shown in FIG. 2. This advantage follows from the fact that the filter of FIG. 2 provides a weighted average sample value of the color television signal taken from an odd number of samples thus eliminating phase displacement of the average samples by one-half sampling period with respect to the originally received samples, as it has been disclosed previously in detail. However, the embodiment of filter 2 shown in FIG. 6, providing an average sample value taken from an even number of consecutive samples could be used as well.

While the invention has been shown and described with particular reference to preferred and alternative embodiments thereof, it will be understood that variations and modifications in form and details may be made therein without departing from the spirit and scope of the invention as defined in the appended claims.

I claim:

1. A system for providing dropout compensation of a digitally encoded composite signal having recurrent intervals of similar information content and including a periodic signal component of a known frequency equal to a non-integral rational number multiple of the frequency of said recurrent intervals, said periodic signal having a known predetermined phase during each consecutive recurrent interval and being symmetrical with respect to a signal crossing axis, the encoded composite signal comprising consecutive digital representations corresponding to discrete amplitude values thereof provided at a frequency equal to a rational number multiple of said periodic signal frequency and in a frequency and phase-locked relationship thereto, said rational number multiple frequency being greater than twice the frequency of the highest frequency component of the composite signal, said system comprising in combination:

a first means coupled to receive and store said consecutive digital representations and to successively provide an average value output signal by arithmetically combining a given number of consecutive digital representations defining a zero average value of said periodic signal component;

a second means having a first input coupled to receive said consecutive digital representations of said composite signal and a second input coupled to receive said output signal of said first means to provide a difference signal;

a third means coupled to receive said difference signal and adjust it to have a phase corresponding to said known predetermined phase of said periodic signal component during that recurrent interval for which the dropout compensation is provided;

a fourth means having a first input coupled to receive said phase-adjusted difference signal and a second input coupled to receive the output signal of said first means to recombine said received signals into a composite signal form;

a fifth means coupled to provide a delay of the composite signal components for a period of time substantially equal to said recurrent interval of said composite signal and a sixth means having a first input coupled to receive said composite signal and a second input coupled to receive said delayed recombined composite signal, said sixth means responsive to a control signal to selectively provide an output composite signal from one of the signals coupled to its first and second inputs, respectively.

2. The system of claim 1 wherein said first means is coupled to arithmetically combine an integral number of consecutive digital representations defining a time interval equal to an integral number of cycles of said periodic signal component.

3. The system of claim 1 wherein said first means comprises means for weighting said consecutive digital representations in accordance with selected weighting coefficients and means for providing a weighted average value output signal by arithmetically combining a given number of said weighted consecutive digital respresentations defining said zero average value.

4. The system of claim 1 wherein said composite signal is a color television signal comprising a luminance and a chrominance signal component, said recurrent intervals are horizontal line intervals, said periodic signal is a color subcarrier signal representative of said chrominance signal component, said color television signal being encoded into consecutive data obtained by sampling at a clock signal frequency equal to a rational number multiple of said subcarrier signal frequency utilizing a sampling signal which is frequency and phase-locked to the subcarrier signal, and wherein:

said first means is coupled to receive and store said consecutive data at said clock signal frequency, said average value output signal of said first means is representative of a separated luminance component, said first means providing a circuit delay equal to a known fixed number of clock signal cycles;

said difference signal provided by said second means is representative of a separated chrominance component;

a compensating delay means is coupled between an input of said first means and said first input of said second means to provide a delay equal to that provided by said first means;

said third means is coupled to delay said separated chrominance component by a number of clock cycles defining substantially one horizontal line period of said color television signal;

said fourth means is coupled to receive at its first input the delayed chrominance component and at its second input the separated luminance component to recombine said received components into a composite signal form;

said fifth means comprises additional delay means coupled to delay both said luminance and chrominance signal components of said color television signal by a number of clock cycles defining one horizontal line period of the color television signal, less a circuit delay provided by said first means; and said sixth means is coupled to receive at its first input said color television signal and at its second input said recombined color televsion signal having its luminance component delayed by one horizontal line period and its chrominance component delayed by two horizontal line periods relative to said received encoded color television signal.

5. The system of claim 4 wherein at least one of said second and said fourth means provides a circuit delay equal to a known fixed number of clock cycles, respectively, said third means providing a one horizontal line delay less said circuit delay provided by said second means and said fifth means provides a one horizontal line delay less combined circuit delays provided by said first and fourth means, respectively.

6. A system for compensation of dropouts in a digitally encoded composite color television signal comprising a luminance component and a chrominance component, said chrominance component including a color subcarrier signal of a known frequency, the encoded color televsion signal comprising consecutive data corresponding to distinct amplitude values thereof, said distinct amplitude values being provided at a clock signal frequency equal to a rational number multiple of said subcarrier signal frequency, said rational number multiple frequency being greater than twice the frequency of the highest frequency component of the composite signal, and said clock signal being frequency and phase-locked to said subcarrier signal, comprising in combination:

a signal averaging means coupled to receive said consecutive data at said clock signal frequency, to store said data for a predetermined number of clock signal cycles, and to successively provide an average value output signal by arithmetically combining a given number of consecutive data defining a zero average value of said subcarrier signal component, said average value output signal being representative of a separated luminance component;

a signal differencing means having a first input coupled to receive said consecutive data and a second input coupled to receive said output signal of said signal averaging means for providing a difference signal representative of a separated chrominance component;

a first delay means coupled to receive said difference signal provided by said differencing means for providing a delay substantially equal to one horizontal line period of the color television signal.

a signal recombining means having a first input coupled to receive an output signal of said first delay means and a second input coupled to receive an output signal of said signal averaging means, for combining said respectively received signals into a composite color television signal;

a second delay means for providing a substantially one horizontal line delay of both said luminance and chrominance signal components of the color television signal; and a switching means having a first input coupled to receive said color television signal and a second input coupled to receive said recombined and delayed color television signal, said switching means responsive to a control signal to selectively provide an output color television signal from one of the signals coupled to its first and second inputs, respectively.

7. The system of claim 6, wherein said signal averaging means provides a time delay equal to a known fixed number of clock cycles, said system further comprising a third fixed compensating delay means coupled between an input of said signal averaging means and said first input of said differencing means to provide a delay equal to that provided by the signal averaging means.

8. The system of claim 6 or 7 wherein said differencing means provides a circuit delay equal to a known fixed number of clock cycles, said first delay means providing a delay equal to a number of clock cycles defining one horizontal line period less said circuit delay provided by said differencing means.

9. The system of claim 7 wherein said signal combining means provides a circuit delay equal to a known fixed number of clock cycles, said second delay means providing a delay equal to a number of clock cycles defining one horizontal line period less combined circuit delays provided by said signal averaging means and signal combining means, respectively.

10. The system of claim 6 for NTSC color television signal dropout compensation, wherein one horizontal line period is defined by a non-integral rational number of clock cycles, and wherein:

said first and second delay means are respectively coupled to provide during consecutive horizontal line periods predetermined alternative complementary delays, each delay corresponding respectively to a higher and lower integral number of clock cycles closest to said non-integral rational number of clock cycles, said complementary delays corresponding to a total amount of delay equal to two horizontal line periods, each of said delay means providing within a given number of consecutive lines an average amount of delay equal to said non-integral number of clock cycles defining one horizontal line period.

11. The system of claim 6 for PAL or PAL-M color television signal dropout compensation, wherein one horizontal line period is defined by a non-integral rational number of clock cycles and the phase of said color subcarrier signal sequentially changes by equal 90 degree increments with respect to the beginning of each consecutive horizontal line interval, and wherein:

said first and second delay means are coupled to provide respective delays each equal to a predetermined fixed integral number of clock cycles during consecutive horizontal line periods, and to provide during each horizontal line period a total delay equal to two horizontal line periods;

wherein means are provided for repositioning in time the beginning of the delay provided during each consecutive horizontal line period by a number of clock cycles corresponding to the 90 degree phase increment of said color subcarrier signal; and wherein each of said delay means provides within a given number of consecutive lines an average amount of delay equal to said non-integral number of clock cycles defining one horizontal line period.

12. The system of claim 10 or 11 wherein:

said signal averaging means provides a circuit delay equal to a known fixed number of clock cycles;

a compensating delay means is coupled between an input of the signal averaging means and said first input of said signal differencing means to provide a delay equal to that provided by said signal averaging means; and said second delay means provides said delay diminished by the circuit delay of said signal averaging means.

13. The system of claim 12 wherein:

at least one of said signal differencing means and signal recombining means provides a circuit delay equal to a know fixed number of clock cycles, respectively;

the first delay means provides said delay diminished by the circuit delay of the signal of the signal differencing means; and the second delay means provides said delay diminished by the combined circuit delays of said signal averaging means and said signal recombining means, respectively.

14. The system of claim 6 wherein said signal averaging means is coupled to arithmetically combine an integral number of consecutive digital data defining a time interval equal to an integral number of cycles of said subcarrier component.

15. The system of claim 6 wherein said averaging means comprises means for weighting said received digital data in accordance with selected weighting coefficients and means for providing a weighted average value output signal by arithmetically combining a given number of said weighted consecutive digital representations defining said zero average value.

16. The system of claim 6 wherein said input of said signal averaging means is coupled to an output of said switching means.

17. The system of claim 6 wherein said input of said signal averaging means is coupled to the first input of said switching means.

18. The system of claim 16 or 17 wherein said second delay means is coupled in the color television signal path between an output of said signal recombining means and said second input of said switching means.

19. The system of claim 16 or 17 wherein said second delay means is coupled in the color television signal path connecting said switching means to said input of said signal averaging means.

20. The system of claim 16 or 17 wherein one said second delay means is coupled in the separated luminance signal path between an output of said averaging means and said second input of said signal recombining means, and another second delay means is coupled in the separated chrominance signal path between an output of said signal differencing means and said first input of said signal recombining means.

21. In a system for providing dropout compensation for a digitally encoded composite color television signal comprising a luminance component and a chrominance component, said chrominance component including a color subcarrier signal of a frequency equal to a non-integral rational number multiple of the horizontal line frequency, said subcarrier signal having a known predetermined phase during each consecutive horizontal line interval of said color television signal, said color television signal being encoded into consecutive digital data by sampling at a frequency equal to an even integral multiple of the subcarrier component frequency, said even integral multiple frequency being greater than twice the frequency of the highest frequency component of the composite signal, the combination comprising:

a signal averaging means coupled to receive said consecutive digital data and to store said date for a predetermined number of clock cycles to successively provide an average value output signal by arithmetically combining a given number selected ones of consecutive data defining a zero average value of said subcarrier component, said average value output signal being representative of a separated luminance component;

a signal differencing means having a first input coupled to receive said consecutive data and a second input coupled to receive said output signal of said signal averaging means for providing a difference signal representative of a separated chrominance component;

a phase adjusting means coupled to receive said difference signal to adjust its phase to correspond to said known predetermined subcarrier signal phase during the consecutive horizontal line intervals during which the dropout compensation is provided;

a signal recombining means having a first input coupled to receive said phase-adjusted difference signal and a second input coupled to receive the output signal of said signal averaging means for recombining said respectively received signals into a composite color television signal;

a delay means coupled to provide a substantially one horizontal line delay of both said luminance and chrominance signal components of said color television signal; and a switching means having a first input coupled to receive said color television signal and a second input coupled to receive said recombined and delayed color television signal, said switching means responsive to a control signal to selectively provide an output signal corresponding to one of the signals coupled to its first and second inputs, respectively.

22. The system of claim 21 wherein said signal averaging means comprises means for weighting and consecutive data in accordance with selected weighting coefficients and means for providing a weighted average value output signal by arithmetically combining a given odd integral number of selected ones of the weighted consecutive data defining said zero average value, each said weighted average value output signal provided by said signal averaging means corresponding to a data occurring in the middle of each said selected ones of consecutive data taken for averaging.

23. The system of claim 21 wherein said input of said averaging means is coupled to an output of said switching means.

24. A digital color television signal dropout compensator suitable for use in NTSC, PAL or PAL-M systems, said signal represented by consecutive data obtained by sampling at a clock signal frequency equal to an integral multiple of the color subcarrier signal frequency, said integral multiple frequency being greater than twice the frequency of the highest frequency component of the color television signal comprising in combination:

a register means for receiving and storing said consecutive data in synchronism with said clock signal frequency;

a signal averaging means coupled to said register means for successively providing an average data value by arithmetically combining an integral number of consecutive data defining an integral number of subcarrier cycles to obtain an output signal representative of a separated luminance component, said averaging means providing a circuit delay equal to a known number of clock cycles;

a signal differencing means having a first input coupled to receive said consecutive data and a second input coupled to receive the output signal of said averaging means to provide a difference signal representative of a separated chrominance component, said differencing means providing a circuit delay equal to a known number of clock cycles;

a first delay means coupled between an input of said signal averaging means and said first input of the differencing means to provide a delay equal to that provided by the signal averaging means; a second delay means coupled to receive said difference signal for providing a delay equal to a number of clock cycles defining one horizontal line period of the color television signal less the circuit delay provided by said differencing means;

a signal combining means having a first input coupled to receive an output signal of said second delay means and a second input coupled to receive an output signal of said signal averaging means, for recombining said respectively received signals into a composite color television signal, said combining means providing a circuit delay equal to a known number of clock cycles;

a third delay means coupled to provide a delay of both said luminance and chrominance component of said color television signal, said delay means corresponding to a number of clock cycles defining one horizontal line period less combined circuit delays provided by said averaging and combining means, respectively; and a switching means having a first input coupled to receive said color television signal and a second input coupled to receive said recombined and delayed color television signal, said switching means responsive to a control signal to selectively provide an output color television signal from one of the signals coupled to its first and second inputs, respectively.

25. A digital color television signal dropout compensator circuit suitable for use in NTSC, PAL, or PAL-M, systems, where the television signal is encoded into consecutive digital data by sampling at a frequency equal to three times the color subcarrier signal frequency, comprising:

means coupled to receive said consecutive data and to provide an average value output signal by continuously combining three consecutive data defining one subcarrier signal cycle, said average output signal corresponding to a separated luminance component;

means coupled to provide a difference signal of said color television signal and said average value output signal, said difference signal corresponding to a separated chrominance component;

means coupled to delay said difference signal by substantially one horizontal line period of the color television signal to provide a one line delayed chrominance component;

means coupled to combine said average value output signal and said delayed difference signal into a composite color television signal form;

means coupled to delay both the chrominance and luminance component of the color television signal processed by said circuit by substantially one horizontal line period to provide a dropout compensation signal having its luminance component delayed by one horizontal line period and its chrominance component by two horizontal line periods; and means having separate respective inputs coupled to receive said color television signal and said dropout compensation signal respectively, said means being responsive to a control signal to selectively provide an output signal corresponding to one of its input signals.

26. A digital color television dropout compensation circuit suitable for use in NTSC, PAL or PAL-M systems, wherein the television signal comprises a color subcarrier component having a known predetermined phase with respect to the beginning of each consecutive horizontal line interval and wherein the television signal is encoded into consecutive digital data by sampling at a frequency equal to four times the color subcarrier signal frequency, comprising:

means coupled to receive said consecutive data and to provide a weighted average value output signal by continuously combining three alternate ones of five consecutive data with the first and fifth data weighted by a factor of one-half and the third data unweighted, respectively, said weighted average value output signal corresponding to a separated luminance component;

means coupled to provide a difference signal of said color television signal and said weighted average value output signal, said difference signal corresponding to a separated chrominance component;

means coupled to adjust said difference signal to have it phase corresponding to said known predetermined subcarrier signal phase with respect to the beginning of that horizontal line interval for which the dropout compensation is provided, to provide a phase-adjusted chrominance component;

means coupled to combine said phase-adjusted difference signal and said weighted average value output signal into a composite color television signal form;

means coupled to delay both the chrominance and luminance component of the color television signal processed by said circuit by substantially one horizontal line period to provide a dropout compensation signal; and means having separated respective inputs coupled to receive said color television signal and said dropout compensation signal, respectively, said means being responsive to a control signal to selectively provide an output signal corresponding to one of it input signals.

27. A digital filter circuit for processing a digitally encoded composite signal having a periodic signal component of a known frequency and symmetrical with respect to a signal crossing axis, the encoded composite signal comprising consecutive digital representations corresponding to a discrete amplitude values thereof provided at a frequency equal to a rational number multiple of said periodic signal frequency and in a frequency and phase-locked relationship to said periodic signal, said rational number multiple frequency being greater than twice the frequency of the highest frequency component of the composite signal, comprising in combination:

a first means coupled to receive and store said consecutive digital representations of said composite signal; and a second means coupled to said first means for arithmetically combining a given number of consecutive digital representations defining a zero average value of said periodic signal component, to provide an average value output signal representative of said digitally encoded composite signal from which the periodic signal component is eliminated.

28. The circuit of claim 27 wherein said second means is coupled to arithmetically combine an integral number of consecutive digital representations defining a time interval equal to an integral number of cycles of said periodic signal component.

29. The circuit of claim 27 wherein said second means is coupled to arithmetically combine an odd integral number of consecutive digital representations and wherein each average value output signal provided by said second means corresponds to a digital representation occurring in the middle of each given number of consecutive digital representations taken for averaging.

30. The circuit of claim 27 wherein said second means comprises means for weighting said consecutive digital representations in accordance with selected weighting coefficients and means for providing a weighted average value output signal by arithmetically combining a given number of said weighted consecutive digital representations defining said zero average value.

31. The circuit of claim 30 wherein said discrete amplitude values of said composite signal are provided at a frequency equal to an even integral number multiple of said periodic signal frequency and said means for providing said weighted average value output signal is coupled to arithmetically combine a given odd integral number of selected ones of said weighted consecutive digital representations defining said zero average value, each said weighted average value output signal provided by said second means corresponding to a digital representation occurring in the middle of each said number of consecutive digital representations taken for averaging.

32. A digital filter circuit for eliminating a chrominance subcarrier signal component from a composite color television signal, said color television signal being encoded into consecutive digital representations by sampling at a frequency equal to a rational number multiple of said subcarrier signal frequency, utilizing a sampling signal whch is frequency and phase-locked to the subcarrier signal, said rational number multiple frequency being greater than twice the frequency of the highest frequency component of the composite signal, comprising:

a first means coupled to receive and store said consecutive digital representations; and a second means coupled to said first means for providing an average value output signal by arithmetically combining a given number of consecutive digital representations which define a zero average value of said subcarrier signal component.

33. The filter circuit of claim 27 or 32, wherein said first means comprises register means for receiving and storing said consecutive digital representations in synchronization with a known clock signal and wherein said second means comprises adding and diviing means for arithmetically combining said given number of consecutive digital representations in synchronization with said clock signal.

34. The filter circuit of claim 32 wherein the sampling signal frequency is equal to an integral multiple of the subcarrier signal frequency and said second means is coupled to provide said average value by arithmetically combining an integral number of consecutive digital representations defining a time interval equal to an integral number of subcarrier signal cycles.

35. The filter circuit of claim 32 wherein said second means is coupled to provide said average value by arithmetically combining a given odd integral number of consecutive digital representations and wherein each average value output signal provided by said second means corresponds to a digital representation occurring in the middle of each said given number of consecutive representations taken for averaging.

36. A digital filter circuit for eliminating a chrominance subcarrier signal component from a digitally encoded composite color television signal comprising consecutive data obtained by sampling at a frequency equal to an even integral multiple of the frequency of said subcarrier signal component, said even integral multiple frequency being greater than twice the frequency of the highest frequency component of the composite signal, said sampling signal being frequency and phase-locked to said subcarrier signal, comprising:

A first means coupled to receive and store said consecutive data; and a second means coupled to said first means for weighting said consecutive data in accordance with selected weighting coefficients and for providing a weighted average data value output signal by arithmetically combining a given odd integral number of weighted consecutive data defining a zero weighted average value of said subcarrier signal component, each weighted average data value output signal corresponding to a data occurring in the middle of each said odd integral number of weighted consecutive data taken for averaging.

37. The circuit of claim 36 wherein the sampling frequency is equal to four times the subcarrier signal frequency, and wherein:

said second means is coupled to provide said weighted average data value by arithmetically combining continuously three alternate ones of five consecutive data with the first and fifth data weighted by a factor of one-half and the third data unweighted.

38. A digital comb filter circuit for eliminating selected periodic signal components from a digitally encoded composite signal, said selected components representing a basic periodic signal of a known frequency and higher and lower order frequency components thereof, said selected signal components being symmetrical with respect to a signal crossing axis, said encoded composite signal comprising consecutive digital representations corresponding to discrete amplitude values thereof provided at a frequency equal to a rational number multiple of said basic periodic signal frequency and in a frequency and phase-locked relationship to said basic period signal, said rational number multiple frequency being greater than twice the frequency of the highest frequency component of the composite signal, comprising in combination:

a first means coupled to receive and store said consecutive digital representations of the composite signal; and a second means coupled to said first means to successively provide an average value output signal by arithmetically combining a given integral number of consecutive digital representations defining a zero average value of said basic periodic signal component in a time interval equal to an integral number of cycles of said basic periodic signal, a lowest order periodic signal component being eliminated by said comb filter having a frequency equal to the frequency of said discrete amplitude values divided by the number of consecutive digital representations taken for averaging .

39. In a system for processing a digitally encoded composite signal having a periodic signal component of a known frequency and symmetrical with respect to a signal crossing axis, said composite signal comprising consecutive digital representations corresponding to discrete amplitude values thereof provided at a frequency equal to a rational number multiple of said periodic signal frequency and in a frequency and phase-locked relationship thereto, said rational number multiple frequency being greater than twice the frequency of the highest frequency component of the composite signal, a combination comprising:

a first means coupled to receive and store consecutive digital representations of said composite signal;

a second means coupled to said first means to successively provide an average value output signal by arithmetically combining a given number of consecutive digital representations defining a zero average value of said periodic signal component, said average value output signal of said second means representing said digitally encoded composite signal from which said periodic signal component is eliminated; and a third means having a first input coupled to receive said output signal of said second means and a second input coupled to receive said consecutive digital representations of said composite signal to provide a difference signal representative of said periodic signal component.

40. In a system as define in claim 39 for separating a luminance and a chrominance signal component of a digitally encoded composite color television signal, said periodic signal component corresponding to a color subcarrier signal, said color television signal being encoded into consecutive digital data by sampling at a clock signal frequency equal to a rational number multiple of said color subcarrier signal frequency, utilizing a sampling signal which is frequency and phase-locked to the subcarrier signal, wherein:

said first means comprises register means for receiving and storing said consecutive data at a said clock signal frequency;

said second means comprises adding and dividing means for arithmetically combining said given number of consecutive data defining a zero average value of said color subcarrier signal in synchronization with said clock signal, said average value output signal of said second means representing said separated luminance component; and said third means is coupled to provide said difference signal in synchronization with said clock signal, said difference signal representing said separated chrominance component.

41. The apparatus of claim 40 wherein said second means provides a circuit delay equal to a known fixed number of clock cycles, said apparatus further comprising a fixed delay means coupled between an input of said second means and said second input of said third means to compensate for said delay provided by said second means.

42. A method for processing a composite signal comprising a periodic signal component of a known frequency and symmetrical with respect to a signal crossing axis, said composite signal being encoded in the form of consecutive digital representations by sampling at a frequency equal to a rational number multiple frequency of said known periodic signal, said rational number multiple frequency being greater than twice the frequency of the highest frequency component of the composite signal, comprising the steps of:

receiving and storing consecutive digital representations of said composite signal; and arithmetically combining a given number of consecutive digital representations which define a zero average value of the periodic signal component to provide an average value output signal representative of the digital composite signal from which the periodic signal component is eliminated.

43. The method of claim 42 wherein the step of arithmetically combining includes combining a given integral number of consecutive digital representations which define a time interval equal to an integral number of cycles of the periodic signal component.

44. The method of claim 42 wherein the step of arithmetically combining further comprises weighting said consecutive digital representations in accordance with selected weighting coefficients and combining a given number of weighted consecutive digital representations defining said zero average value.

45. The method of claim 44 wherein the sampling frequency is an even integral multiple of the periodic signal frequency and wherein the step of arithmetically combining includes combining a given odd integral number of selected ones of said weighted consecutive digital representations defining said zero average value, each weighted average value output signal corresponding to a digital representation occurring in the middle of each said odd number of consecutive digital representations taken for averaging.

46. A method of digitally separating the chrominance and luminance component of a digital composite color television signal represented by consecutive data obtained by sampling at a frequency equal to a rational multiple frequency of the color subcarrier component, utilizing a sampling signal frequency and phase-locked to the subcarrier signal, said rational number multiple frequency being greater than twice the frequency of the highest frequency component of the composite signal, comprising the steps of:

receiving and storing the consecutive data in preparation for subsequent arithmetical combination thereof;

arithmetically combining successively a given number of consecutive data which define a zero average value of the color subcarrier component to provide an average data value output signal representing the separated luminance component; and subtracting the obtained average data value output signal from said digital composite color television signal to obtain a difference signal representing the separated chrominance component.

47. The method of claim 46 wherein the consecutive data is obtained by sampling at a frequency equal to three times the color subcarrier signal frequency, and wherein the step of arithmetically combining includes successively combining three consecutive data to provide said average data value output signal, each obtained average data corresponds to that data which occurs in the middle of the three consecutive data.

48. The method of claim 46 wherein the consecutive data is obtained by sampling at a frequency equal to four times the color subcarrier signal frequency, and wherein the step of arithmetically combining includes:

successively combining three alternate ones of five consecutive data, with the first and fifth data weighted by one-half and the third data unweighted, to provide a weighted average data value output signal, each obtained average data corresponding to a data occurring in the middle of said five consecutive data.

49. A digital filter circuit for processing a digital signal representing a composite signal having a signal component of a known frequency, the digital signal comprising consecutive digital value representations at a frequency equal to a rational number multiple of said known frequency and in a frequency and phase locked relationship to said signal component, said rational number multiple frequency being greater than two times said known frequency, comprising:

first means responsive to a clock signal in synchronism with said rational number multiple frequency for receiving and storing each of said consecutive digital value representations for a duration corresponding to an interval defined by at least three consecutive digital value representations received by the first means; and second means coupled to said first means for arithmetically combining each received digital value representation with a selected number of other selected ones of said received digital value representations to generate in place of said each received digital value representation a further digital value representation of the average of the values of said arithmetically combined digital value representations that is productive of a zero average of a portion of said arithmetically combined digital value representations corresponding to said signal component of a known frequency.

50. The digital filer circuit according to claim 49 wherein the digital signal represents an analog composite signal and further comprising an analog-to-digital converter means coupled to receive the analog composite signal and responsive to a clock signal for converting the received composite signal to a consecutive digital value representations at a frequency of the clock signal, and a clock signal generator means responsive to the signal component of known frequency contained in the composite signal for generating the clock signal at a frequency which is said rational number multiple of the frequency of said signal component.

51. A system for processing a digital signal representing a composite signal having recurrent intervals of similar information to replace deficient portions of the composite signal with similar information from different recurrent intervals, said composite signal including a signal component of a known frequency equal to a non-integral rational number multiple of the frequency of said recurrent intervals and having a known nominal phase during each recurrent interval, the digital signal comprising consecutive digital value representations at a frequency equal to a rational number multiple of said known frequency and in a frequency and phase locked relationship to said signal component, said rational number multiple frequency being greater than two times said known frequency, comprising:

first means responsive to a clock signal in synchronism with said rational number multiple frequency for receiving at an input each of said consecutive digital value representations and arithmetically combining said each digital value representation with a selected number of other selected ones of said received digital value representations to generate in place of said each received digital value representation a further digital value representation of the average of the values of said arithmetically combined digital value representations that is productive of a zero average of a portion of said arithmetically combined digital value representation corresponding to said signal component of a known frequency;

second means coupled to receive said consecutive digital value representations of said composite signal and said further digital value representation generated by said first means to provide a digital difference value representation of the difference between each received digital value representation of the difference between each received digital value representation and each further digital value representation generated in place of said each received digital value representation;

third means coupled to receive said digital difference value representation for adjusting its phase to correspond to the nominal phase of the signal component during the recurrent interval to be replaced by a dropout compensation composite signal including said digital difference value representation;

fourth means coupled to receive each phase-adjusted digital difference value representation and each further digital value representation to combine the received representations to form the dropout compensation composite signal at an output;

fifth means coupled in circuit with said first, second, third and fourth means between said input and output for delaying the representations forming said dropout compensation composite signal for an interval substantially equal to the recurrent interval of said composite signal; and sixth means coupled to receive said digital signal and the delayed dropout compensation composite signal and responsive to a control signal indicative of the occurrence of deficient portions in the composite signal to selectively provide at an output one of said received signals, said sixth means responsive to said control signal to provide the delayed dropout compensation composite signal at said output when said control signal is indicative of the occurrence of a deficient portion and to provide said digital signal at said output in the absence of said control signal being indicative of the occurrence of a deficient portion.

52. The system according to claim 51 wherein the fifth means for delaying the representations forming the dropout compensation composite signal is coupled to receive and delay the dropout compensation composite signal provided by the fourth means.

53. The system according to claim 51 wherein the composite signal is a color television signal and the signal component of known frequency is a color subcarrier component including a color burst synchronizing portion occurring at the beginning of each recurrent interval at the nominal phase, the third means for adjusting the phase of the digital difference value representation is a first adjustable delay means for delaying the digital difference value representation for an interval substantially equal to one recurrent interval of the color television signal relative to the occurrence at the input of the first means of the portion of the color television signal from which the delayed digital difference value representation was obtained, the fifth means for delaying the representations forming the dropout composite signal is a second adjustable delay means, and said first and second adjustable delay means responsive to said clock signal in synchronism with said rational multiple frequency for synchronously adjusting the delay provided by each of the delay means during alternate recurrent intervals by an interval equal to one clock signal cycle.

54. A method of processing a digital signal representing a composite signal having a plurality of signal components one of which is of a known frequency, the digital signal comprising consecutive digital value representations at a frequency equal to a rational number multiple of said known frequency and in a frequency and phase locked relationship to said one signal component of a known frequency, said rational number multiple frequency being greater than two times said known frequency, the steps comprising:

transmitting consecutive digital value representations through a digital signal transmission path at a rate corresponding to and synchronous with said rational number multiple frequency, said transmission path of a length equal to an interval defined by at least three consecutive digital value representations;

combining each digital value representation transmitted through the digital value representation transmitted through the digital signal transmission path with a selected number of other selected ones of said digital value representations being transmitted through said digital signal transmission path to generate in place of said each digital value representation a further digital value representation of the summation of the values of said combined digital value representations that is productive of a zero summed value of a portion of said combined digital value representations corresponding to said signal component of a known frequency; and weighting each further digital value representation to obtain an output digital value representation of the average of the values represented by the combined digital value representations.

* * * * *

UNITED STATES PATENT AND TRADEMARK OFFICE
CERTIFICATE OF CORRECTION

PATENT NO. : 4,251,831
DATED : February 17, 1981
INVENTOR(S) : Bantval Y. Kamath It is certified that error appears in the above-identified patent and that said Letters Patent is hereby corrected as shown below:

Column 52, line 52 to line 53, delete "the digital value representation transmitted through".

Signed and Sealed this

Fifteenth Day of May 1984

[SEAL]

Attest:

GERALD J. MOSSINGHOFF

Attesting Officer

Commissioner of Patents and Trademarks